(12) United States Patent
Lin et al.

(10) Patent No.: US 12,294,030 B2
(45) Date of Patent: May 6, 2025

(54) NANO-SHEET-BASED COMPLEMENTARY METAL-OXIDE-SEMICONDUCTOR DEVICES WITH ASYMMETRIC INNER SPACERS

(71) Applicant: Taiwan Semiconductor Manufacturing Co., Ltd., Hsin-Chu (TW)

(72) Inventors: Shih-Hao Lin, Hsinchu (TW); Chih-Hsuan Chen, Hsinchu (TW); Chia-Hao Pao, Kaohsiung (TW); Chih-Chuan Yang, Hsinchu (TW); Chih-Yu Hsu, Hsinchu County (TW); Hsin-Wen Su, Hsinchu (TW); Chia-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/673,746

(22) Filed: May 24, 2024

(65) Prior Publication Data
US 2024/0313119 A1 Sep. 19, 2024

Related U.S. Application Data

(63) Continuation of application No. 17/319,695, filed on May 13, 2021, now Pat. No. 11,996,484.

(51) Int. Cl.
| | |
|---|---|
| *H01L 29/786* | (2006.01) |
| *H01L 21/8238* | (2006.01) |
| *H01L 27/092* | (2006.01) |
| *H01L 29/06* | (2006.01) |

(Continued)

(52) U.S. Cl.
CPC ........... *H01L 29/78621* (2013.01); *H01L 21/823814* (2013.01); *H01L 27/092* (2013.01);
(Continued)

(58) Field of Classification Search
CPC .......... H01L 29/66742; H01L 29/0847; H01L 29/66545; H01L 29/775; H01L 21/823814;
(Continued)

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

*Primary Examiner* — Mouloucoulaye Inoussa
(74) *Attorney, Agent, or Firm* — HAYNES AND BOONE, LLP

(57) ABSTRACT

A semiconductor structure includes a first pair of source/drain features (S/D), a first stack of channel layers connected to the first pair of S/D, a second pair of S/D, and a second stack of channel layers connected to the second pair of S/D. The first pair of S/D each include a first epitaxial layer having a first dopant, a second epitaxial layer having a second dopant and disposed over the first epitaxial layer and connected to the first stack of channel layers, and a third epitaxial layer having a third dopant and disposed over the second epitaxial layer. The second pair of S/D each include a fourth epitaxial layer having a fourth dopant and connected to the second stack of channel layers, and a fifth epitaxial layer having a fifth dopant and disposed over the fourth epitaxial layer. The first dopant through the fourth dopant are of different species.

20 Claims, 24 Drawing Sheets

(51) Int. Cl.
  *H01L 29/167*   (2006.01)
  *H01L 29/45*    (2006.01)
  *H01L 29/66*    (2006.01)

(52) U.S. Cl.
  CPC ...... *H01L 29/167* (2013.01); *H01L 29/66553* (2013.01); *H01L 29/66742* (2013.01); *H01L 29/78696* (2013.01); *H01L 29/0665* (2013.01); *H01L 29/456* (2013.01)

(58) Field of Classification Search
  CPC ......... H01L 29/66553; H01L 29/78621; H01L 29/0673; H01L 27/092; H01L 29/78618; H01L 29/78696; H01L 29/42392; H01L 29/167; H01L 29/66439; H01L 29/456; H01L 29/665; H01L 29/0665; H01L 29/7848; H01L 29/165; H01L 21/02603; H01L 21/02236; H01L 29/6653; B82Y 10/00
  See application file for complete search history.

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2014/0151639 A1 | 6/2014 | Chang et al. |
| 2019/0067490 A1 | 2/2019 | Yang et al. |
| 2020/0168742 A1 | 5/2020 | Wang et al. |
| 2020/0220018 A1 | 7/2020 | Jang et al. |
| 2020/0365692 A1 | 11/2020 | Jung et al. |
| 2020/0395445 A1 | 12/2020 | Choi et al. |
| 2020/0395446 A1 | 12/2020 | Yi et al. |
| 2021/0066477 A1 | 3/2021 | Lee et al. |
| 2021/0126106 A1 | 4/2021 | Wang et al. |
| 2021/0126135 A1 | 4/2021 | Lee et al. |

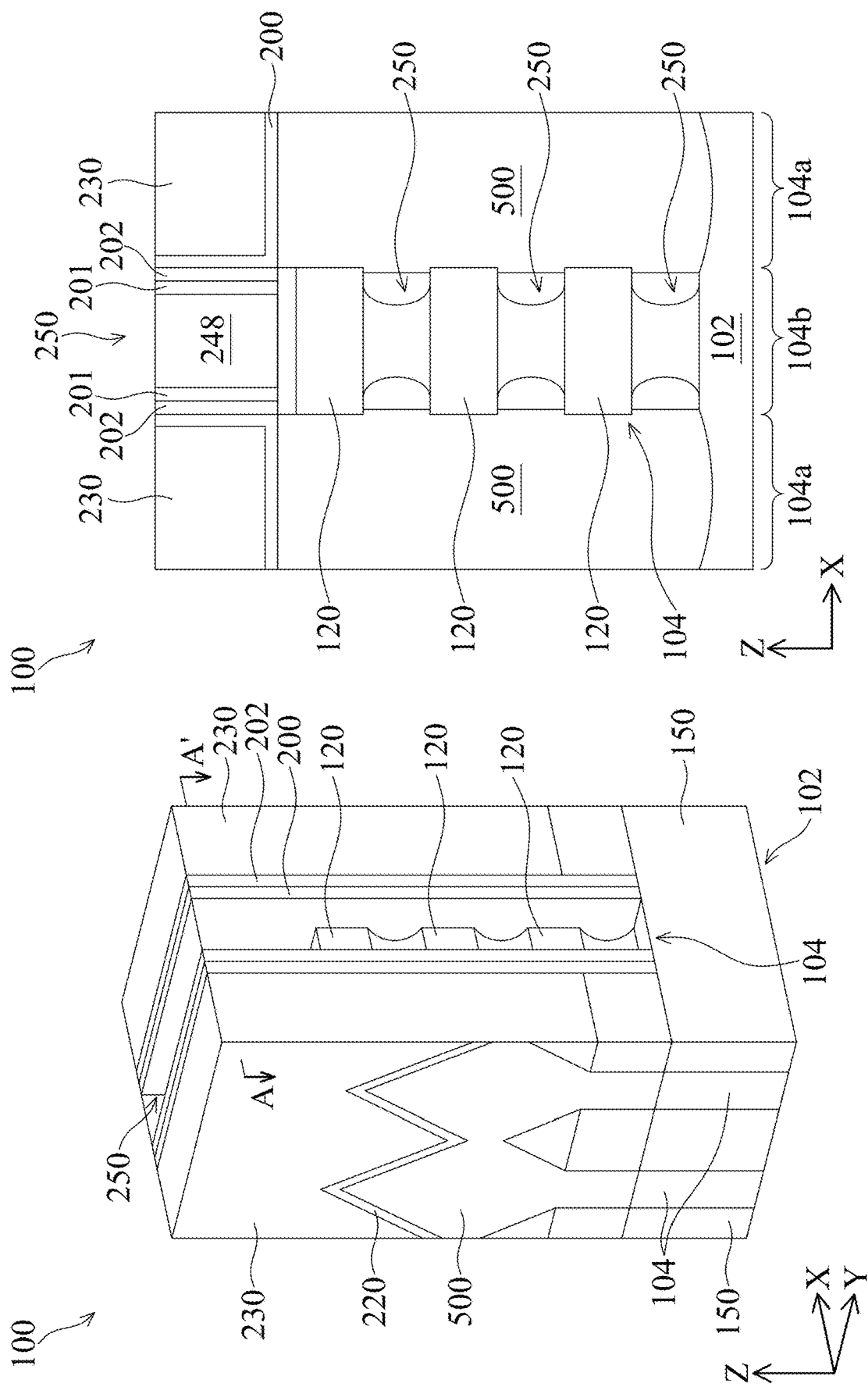

NANO-SHEET-BASED COMPLEMENTARY METAL-OXIDE-SEMICONDUCTOR DEVICES WITH ASYMMETRIC INNER SPACERS

PRIORITY DATA

The present application is a continuation application of U.S. patent application Ser. No. 17/319,695, filed on May 13, 2021, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is nano-sheet-based transistor, whose gate structure extends around its channel region providing access to the channel region on all sides. The nano-sheet-based transistors are compatible with conventional metal-oxide-semiconductor (MOS) processes, allowing them to be aggressively scaled down while maintaining gate control and mitigating SCEs. However, conventional methods for nano-sheet-based transistors may still suffer from junction leakages in regions below the lowest suspended channels and from high capacitance at the front end of line (FEOL). Therefore, although conventional nano-sheet-based transistors have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a three-dimensional (3D) perspective view of an embodiment of a nano-sheet-based device that may be implemented as an NMOS or a PMOS in embodiments of the present disclosure constructed according to some embodiments of the present disclosure.

FIG. 1B is a cross-sectional view of an embodiment of a nano-sheet-based device that may be implemented as an NMOS or a PMOS in embodiments of the present disclosure along the line A-A' in FIG. 1A constructed according to some embodiments of the present disclosure.

DETAILED DESCRIPTION

Figure 2A:
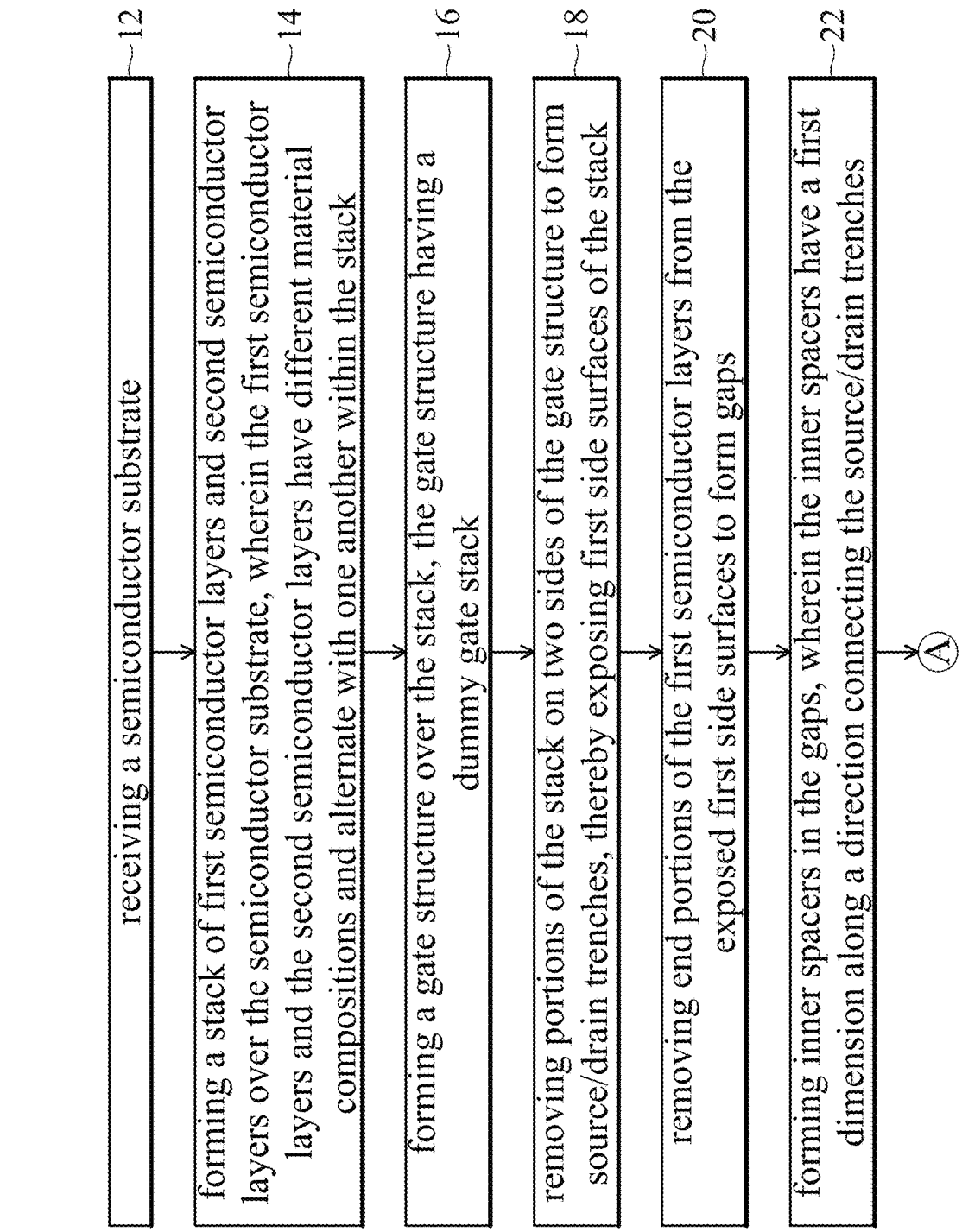
FIGS. 2A, 2B, and 15A, 15B are flow charts of embodiments of methods for fabricating nano-sheet-based devices of the present disclosure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are referred to as nano-sheet-based transistors (or interchangeably nano-sheet-based devices). A nano-sheet-based device includes a plurality of suspended channel layers stacked one on top of another and engaged by a gate structure. The channel layers of a nano-sheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes. Further, the channel layers of the nano-sheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on). Sometimes, nano-sheet-based devices include source/drain features that extend into the semiconductor substrate and below the lowest channel layer. This region is referred to herein as the sub-channel region. Unlike higher channels that are surrounded by portions of gate structure, the sub-channel region is only controlled by a portion of gate structure from its top surface. As a result, the gate control of this region is much weaker as compared to higher channels. The sub-channel region may therefore suffer from junction leakages. Moreover, the sub-channel region may further present high capacitance (such as gate-to-drain capacitance $C_{gd}$ and the total gate capacitance $C_{gg}$) at the front end of line (FEOL) and contribute to overall reduced performance. In other words, the portion of source/drain features in the sub-channel regions may adversely affect device performances. Accordingly, the present disclosure provides methods that minimize such adverse effects of this portion of source/drain features by reducing charge carrier mobility therein. These methods therefore reduce leakage current and capacitance. Performance improvements are thus achieved. The nano-sheet based devices presented herein may be an n-type metal-oxide-semiconductor (NMOS) device, a p-type metal-oxide-semiconductor (PMOS) device, or a complementary metal-oxide-semiconductor (CMOS) device. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

An example nano-sheet-based transistor 100 (or nano-sheet-based device 100, or device 100) is illustrated in FIGS. 1A and 1B. FIG. 1A is a three-dimensional (3D) perspective view of an embodiment of device 100 that may be implemented as an NMOS device, a PMOS device, or part of a CMOS device, according to embodiments of the present disclosure. FIG. 1B is a cross-sectional view of the device 100 of FIG. 1A along the line A-A'. As illustrated, the device 100 includes a semiconductor substrate 102 (or substrate 102). Fin structures (or fins) 104 are formed over the substrate 102, each extending lengthwise horizontally in an X-direction and separated from each other horizontally in a Y-direction. The X-direction and the Y-direction are perpendicular to each other, and the Z-direction is orthogonal (or normal) to a horizontal XY plane defined by the X-direction and the Y-direction. The substrate 102 may have its top surface parallel to the XY plane.

The fin structures 104 each have a source region 104a and a drain region 104a disposed along the X-direction. The source region 104a and the drain region 104a are collectively referred to as the source/drain regions 104a. Epitaxial source/drain features 500 are formed in or on the source/drain regions 104a of the fin structure 104. In some embodiments, the epitaxial source/drain features 500 may merge together, for example, along the Y-direction between adjacent fin structures 104 to provide a larger lateral width than an individual epitaxial source/drain feature. The fin structures 104 each further have a channel region 104b disposed between and connecting the source/drain regions 104a. The fin structures 104 each include a stack of suspended semiconductor layers 120 (also interchangeably referred to as "semiconductor layers 120," "suspended channel layers 120," or "channel layers 120") in the channel region 104b of the fin structures 104 and the stack extends vertically (e.g. along the Z-direction) from the substrate 102. Each of the suspended semiconductor layers 120 connects a pair of epitaxial source/drain features 500. The suspended semiconductor layers 120 may each be in one of many different shapes, such as wire (or nanowire), sheet (or nanosheet), bar (or nano-bar), and/or other suitable shapes, and may be spaced away from each other. In the depicted embodiments, there are three semiconductor layers 120 in the stack. However, there may be any appropriate number of layers in the stack, such as 2 to 10 layers. The semiconductor layers 120 may each engage with a single, contiguous gate structure 250. Note that the gate structure 250 is illustrated as a transparent feature in FIG. 1A in order to illustrate the features (such as the semiconductor layers 120) that the gate structure 250 covers. FIGS. 1A and 1B have been abbreviated to provide a general picture of the device 100, and do not include all details. Additional details of the fin structures 104, the epitaxial source/drain features 500, and the gate structures 250 are described in conjunction with subsequent figures.

The device 100 further includes isolation features 150 within or over the substrate 102, separating adjacent fin structures 104 from each other. The isolation features 150 may be shallow trench isolation (STI) features. In some examples, the formation of the isolation features 150 includes etching trenches into the substrate 102 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 102 and a filling layer (e.g., silicon nitride or silicon oxide) over the thermal oxide liner layer. Alternatively, the isolation features 150 may be formed using any other isolation technologies. As illustrated in FIG. 1A, the fin structure 104 is located above the top surface of the isolation features 150. In the depicted embodiment, the device 100 further includes gate spacer layers 201 on both sides of the gate structures 250; gate spacer layers 202 on two sides of the gate spacer layers 201; contact etch stop layers 220 over the epitaxial source/drain features 500; and interlayer dielectric (ILD) layer 230 over the epitaxial source/drain features 500 and over the contact etch stop layers 220.

Figure 2B:
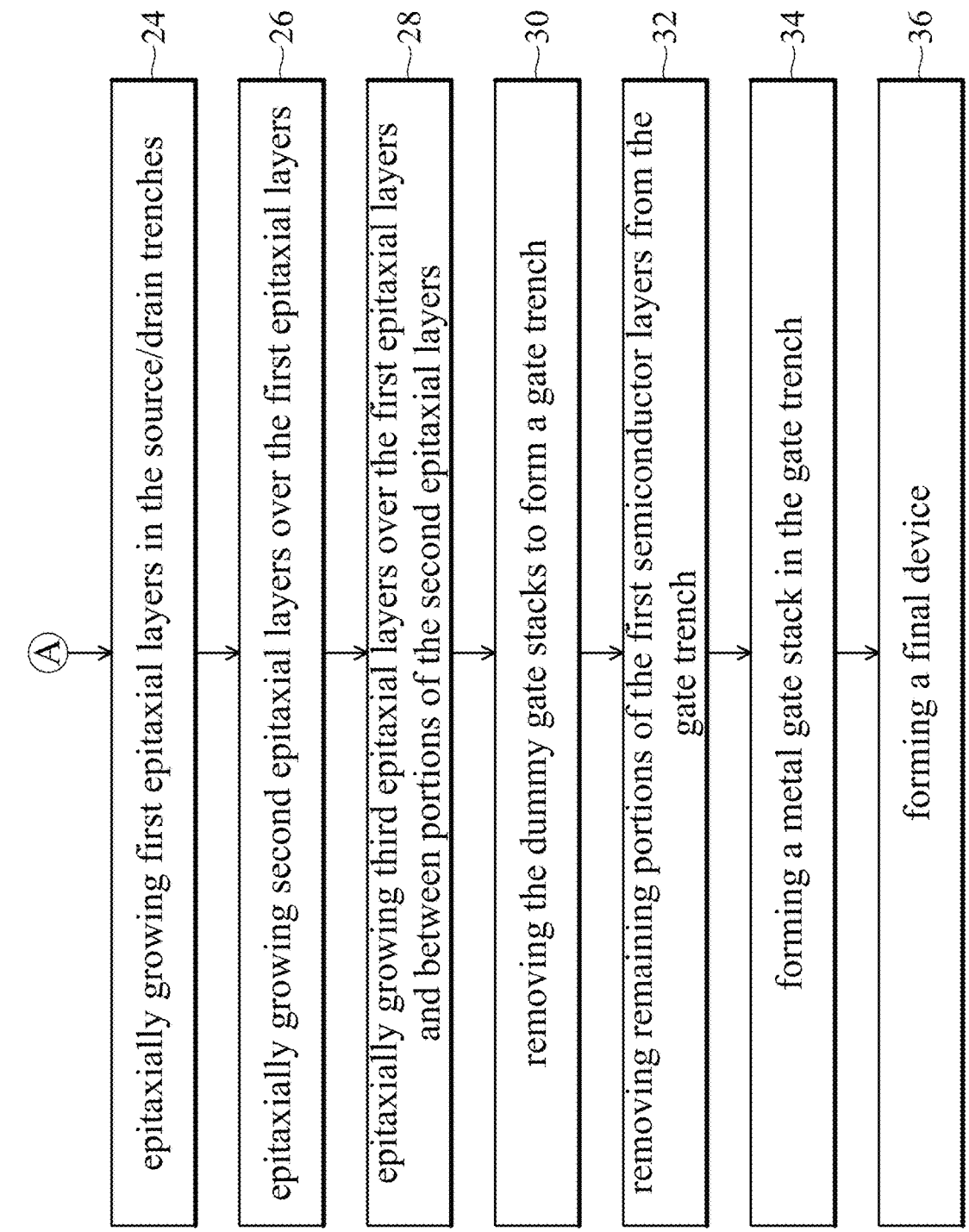

FIGS. 2A-2B are flow charts illustrating an example method 10 for fabricating a device 100 of the present disclosure according to some embodiments of the present disclosure. FIGS. 3-14, 10', and 11' are cross-sectional views of the device along the line A-A' in FIG. 1A constructed at various fabrication stages according to embodiments of the method 10.

Figure 3:
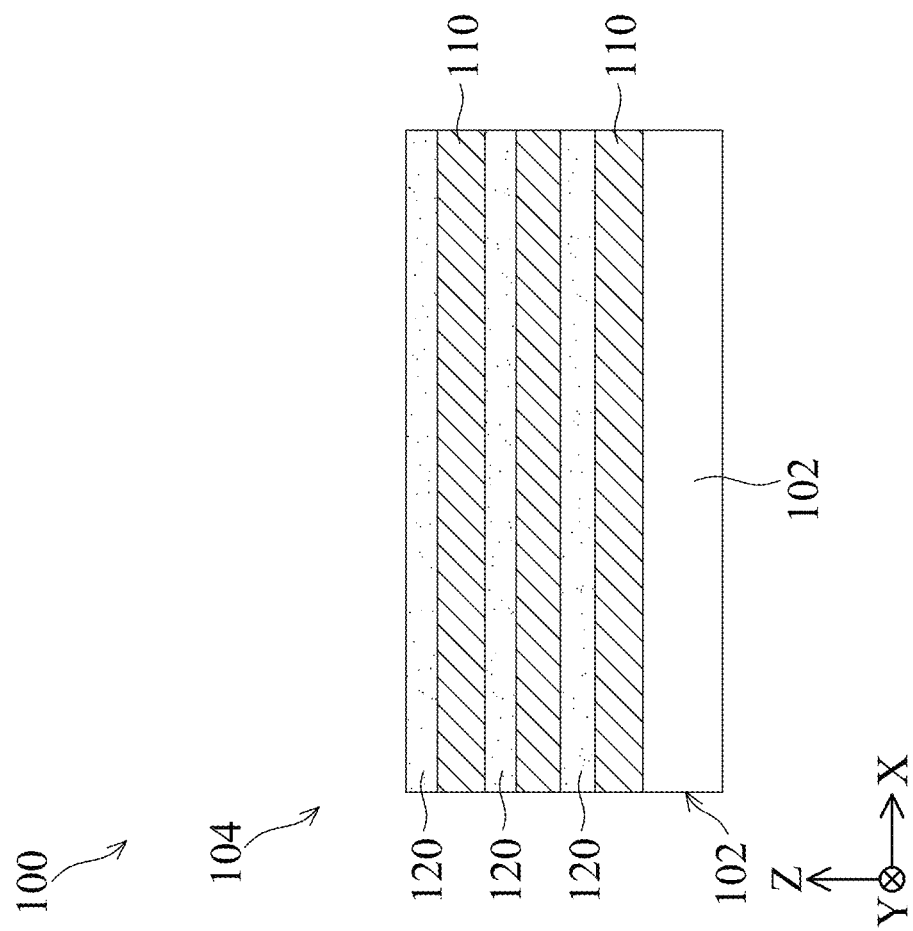
FIGS. 3, 4, 5, 6, 7, 8, 9, 10, 10', 11, 11', 12, 13, 14, 16, 17, 18, 19, and 20 are cross-sectional views of embodiments of nano-sheet-based devices of the present disclosure along the line A-A' in FIG. 1A constructed at various fabrication stages according to some embodiments of the present disclosure.

Referring to block 12 of FIG. 2A and FIG. 3, the device 100 includes a substrate 102. The substrate 102 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 102 may also include a semiconductor-on-insulator substrate, such as Si-on-insulator (SOI), SiGe-on-insulator (SGOI), Ge-on-insulator (GOI) substrates. Descriptions below with respect to FIGS. 3-14, 10' and 11' illustrate use the fabrication of an NMOS device 100 as an example. The same of similar methods may be implemented for PMOS devices or CMOS devices, as described later.

Referring to block 14 of FIG. 2A and FIG. 3, a stack of semiconductor layers are formed over the substrate 102. The stack of semiconductor layers include semiconductor layers 110 and semiconductor layers 120 alternating with each other. For example, a semiconductor layer 110 is formed over the substrate 102; a semiconductor layer 120 is formed over the semiconductor layer 110; and another semiconductor layer 110 is formed over the semiconductor layer 120, so on and so forth. The material compositions of the semiconductor layers 110 and 120 are configured such that they have an etching selectivity in a subsequent etching process. For example, in some embodiments, the semiconductor layers 110 contain silicon germanium (SiGe), while the semiconductor layers 120 contain silicon (Si). In some other embodiments, the semiconductor layers 120 contain SiGe, while the semiconductor layers 110 contain Si. In yet some other embodiments, the semiconductor layers 120 and 110 both contain SiGe, but have different Ge atomic concentrations. The semiconductor layers 110 may each have a same or different thickness from each other, and from thickness(es) of the semiconductor layers 120.

The stacks of semiconductor layers are patterned into a plurality of fin structures 104 such that they each extend along the X-direction. The fin structures 104 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 104 may have lateral widths along the Y-direction that are the same between each other or different from each other.

Figure 4:
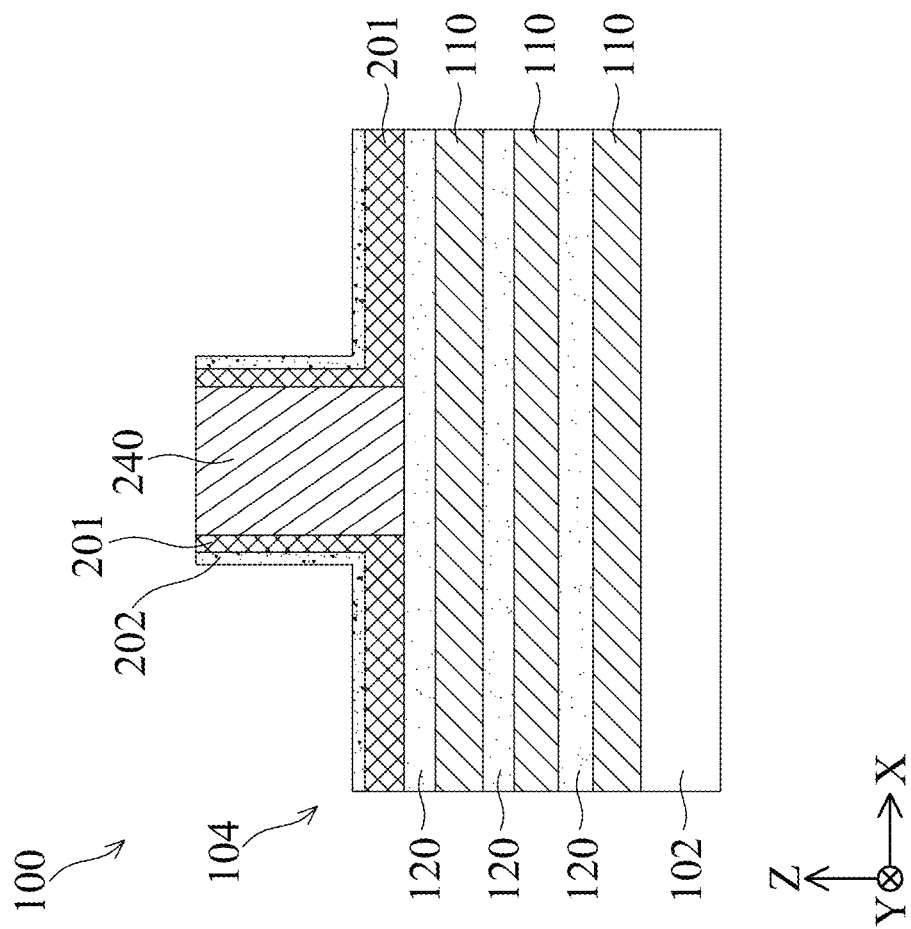

Referring to block 16 of FIG. 2A and FIG. 4, gate structures 250 are formed over a portion of each of the fin structures 104. In some embodiments, the gate structures 250 are also formed over the isolation features 150 in between adjacent fin structures 104. The gate structures 250 may be configured to extend lengthwise parallel to each other, for example, each along the Y-direction. In some embodiments, the gate structures 250 each wrap around the top surface and side surfaces of each of the fin structures 104. The gate structures 250 may include a dummy gate stack 240. The dummy gate stack 240 includes a dummy gate dielectric layer, a dummy electrode layer, as well as one or more hard mask layers (not shown) used to pattern the dummy gate electrode layer. In some embodiments, the dummy electrode layer includes polysilicon. The dummy gate stacks 240 may undergo a gate replacement process through subsequent processing to form metal gates, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, or combinations thereof.

Gate spacers are formed on the sidewalls of the dummy gate stacks 240 and on the top layer of the semiconductor layers 120. Gate spacers may include a single layer or a multi-layer structure. For example, in the depicted embodiment, a gate spacer layer 201 is formed over the top surface of the device, and a gate spacer layer 202 is formed over the gate spacer layer 201. The gate spacer layers 201 and 202 may each include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacer layers 201 and 202 may collectively has a thickness in the range of a few nanometers (nm). In some embodiments, the gate spacer layers 201 and/or 202 may be formed by depositing a spacer layer (containing the dielectric material) over the dummy gate stacks 240, followed by an anisotropic etching process to remove portions of the spacer layer from the top surfaces of the dummy gate stacks 240. After the etching process, portions of the spacer layer on the sidewall surfaces of the dummy gate stacks 240 substantially remain and become the gate spacer layers 201 and/or 202. In some embodiments, the anisotropic etching process is a dry (e.g. plasma) etching process. Additionally or alternatively, the formation of the gate spacer layers 201 and 202 may also involve chemical oxidation, thermal oxidation, ALD, CVD, and/or other suitable methods.

Figure 5:
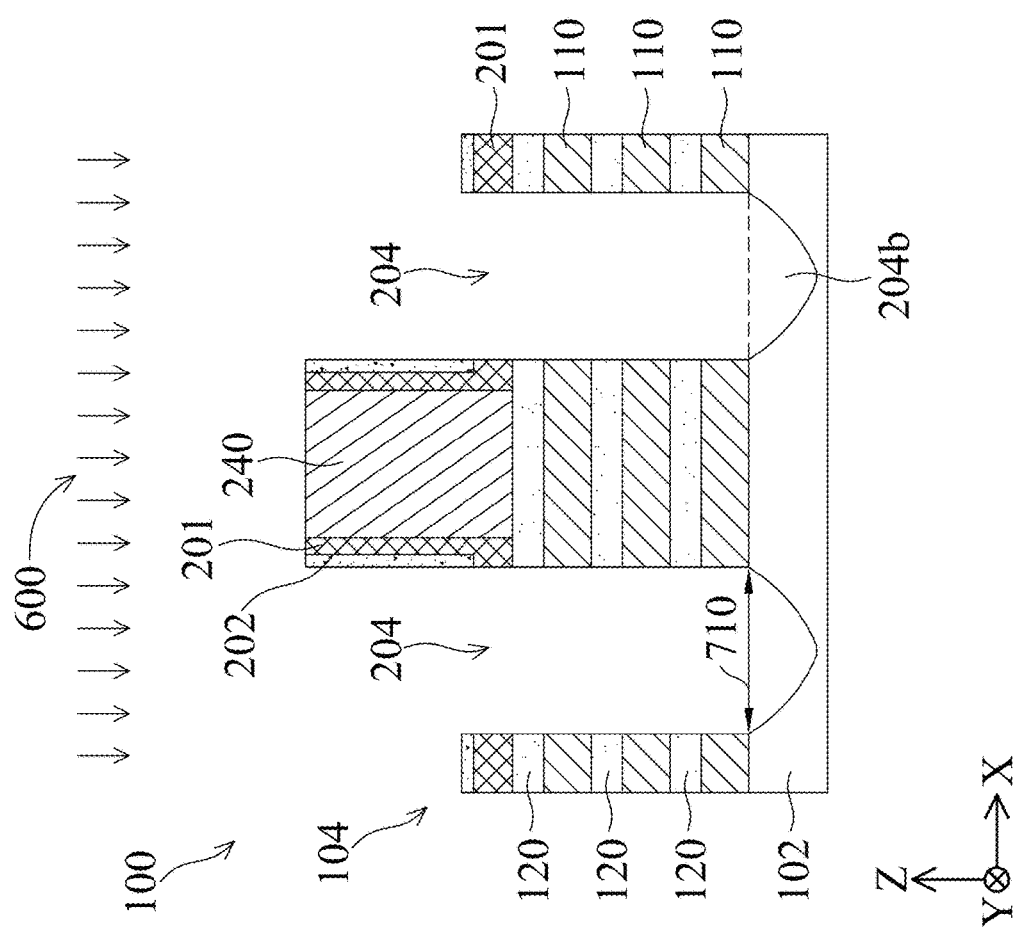

Referring to block 18 of FIG. 2A and FIG. 5, portions of the fin structure 104 adjacent to and exposed by the gate structures 250 (e.g. in the source/drain regions 104a) are at least partially recessed (or etched away) by process 600 to form the source/drain trenches 204. Meanwhile, the portions of the fin structure 104 underneath the gate structures 250 remain intact. Additional mask elements (such as photoresists) may also be employed to protect areas not designed to be removed during the process 600. In the depicted embodiment, the process 600 removes not only the exposed portions of fin structure 104, but also a portion of the underlying substrate 102. Accordingly, the source/drain trenches 204 extends below the top surface of the substrate 102. The bottom portion of the source/drain trenches 204 below the top surface of the substrate 102 are hereinafter referred to as trench portions 204b. The trench portions 204b are below the lowest layer of subsequently formed channel layers. Accordingly, the trench portions 204b may be referred to as the "sub-channel" portion of the source/drain trench 204. The process 600 may include multiple lithography and etching steps, and may use any suitable methods, such as dry etching and/or wet etching. In some embodiments, the trenches 204b has a profile that resembles the "V" letter although the two prongs of the "V" may be curved, and the bottom of the "V" may be rounded. However, the present disclosure contemplates trench portions 204b that have any suitable profiles. In some embodiments, the top surface of the trench portions 204b may have a width 710 along the X-direction. This dimension determines the maximum width of the subsequently formed epitaxial layers in the trench portions 204b.

The formation of the source/drain trenches 204 exposes sidewalls of the stack of semiconductor layers 110 and 120.

Figure 6:
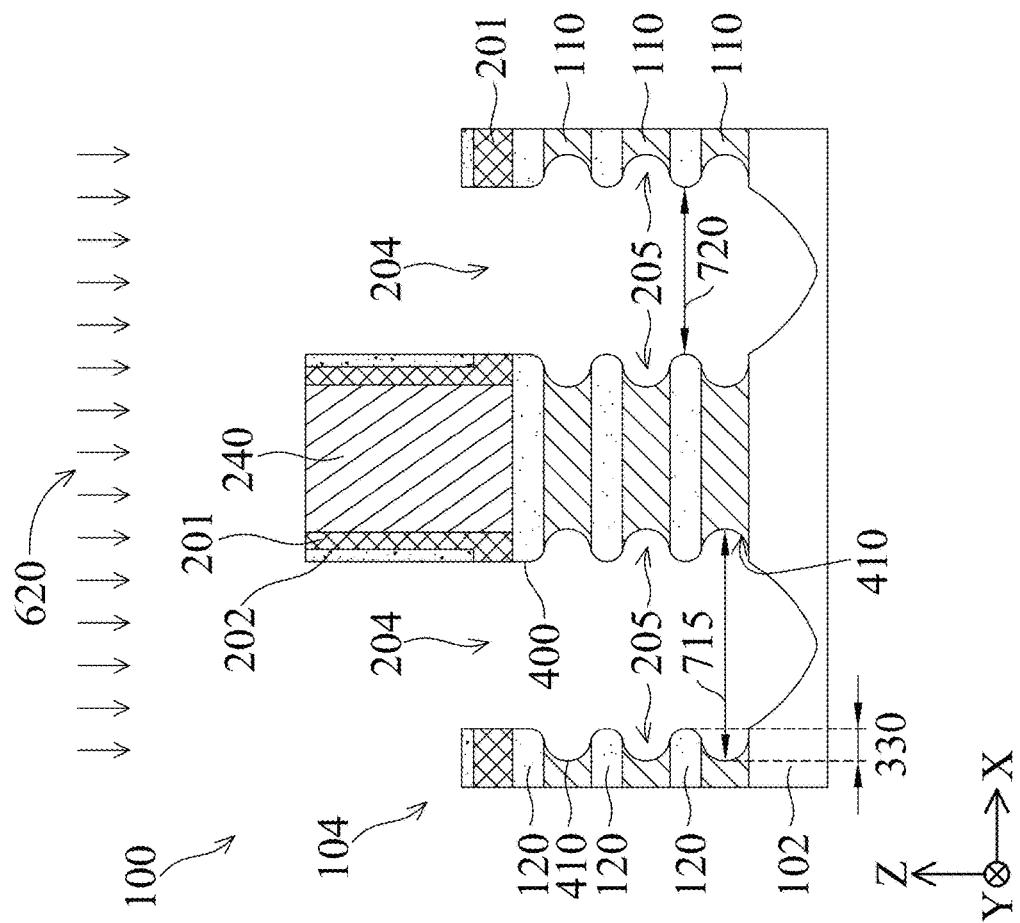

Referring to block 20 of FIG. 2B and FIG. 6, portions of the semiconductor layers 110 are removed through the exposed sidewall surfaces in the source/drain trenches 204 via a selective etching process, such as process 620. Because process 620 recesses the semiconductor layers 110 in a lateral direction along the X-direction, process 620 may sometimes be referred to as a lateral etching process, or a lateral recessing process. The process 620 is designed to remove end portions of the semiconductor layers 110 but only minimally affect the semiconductor layers 120. For example, two end portions of the semiconductor layers 110 may be removed to form openings 205, while the end portions of the semiconductor layers 120 directly above and below the openings 205 are substantially preserved. In other words, openings 205 are formed in between the vertically adjacent semiconductor layers 120.

The openings 205 formed during the process 620 extend the source/drain trenches 204 into areas beneath the semiconductor layers 120 and under the gate spacer layers 201 and 202. The extent to which the semiconductor layers 110 are laterally recessed (or the size of the portion removed) is determined by the processing conditions such as the duration that the semiconductor layers 110 is exposed to an etching chemical. In the depicted embodiments, the duration is controlled such that the opening 205 has a depth 330 along the X-direction. The depth 330 determines the upper limit of the lateral widths of inner spacers to be formed within the openings 205. In some embodiments, the etching process conditions cause the openings 205 to have curved surfaces. For example, as illustrated in FIG. 6, the remaining portions of the semiconductor layers 110 may have a concave surface 410 facing the openings 205. Accordingly, the openings 205 may have a larger width (along the X-direction) at its mid-height (along the Z-direction) than at its top or bottom interfaces with the semiconductor layers 120 or substrate 102. In the depicted embodiment, the width of the openings 205 at the mid-height is referred to as width 715. The width 715 is greater than width 710 (see FIG. 5).

Additionally, the sidewalls of the semiconductor layers 120 may also have curved surfaces after process 620 completes. As described above, although the semiconductor layers 120 are largely preserved during the process 620 due to their etching resistance to the etching chemical, they nevertheless may have their profiles slightly modified, particularly in their end portions above and below the openings 205. For example, prior to the process 620, these end portions may have substantially straight sidewall surfaces (see FIG. 5). After the process 620, the sidewall surfaces become more rounded and with a convex profile facing the source/drain trenches 204. The sidewall surface after the process 620 is referred to as surface 400. In other words, the semiconductor layers 120 may have a larger length along the X-direction at its mid-height (along the Z-direction) than at its top or bottom interfaces with the semiconductor layers 110 (and the openings 205). In some embodiments, two opposing surfaces 400 are separated by a distance (or separation) 720. The separation 720 determines a lateral dimension of a subsequently formed epitaxial layers. In some embodiments, the separation 720 is about 40 nm to about 60 nm.

The process 620 may be any suitable processes. In an embodiment, the semiconductor layers 120 include Si and the semiconductor layers 110 include SiGe. The process 620 may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe semiconductor layers 110 may be etched away in the SC-1 solution at a substantially faster rate than the Si semiconductor layers 120. The etching duration is adjusted such that the size of the removed portions of SiGe layers is controlled. As a result, desired portions of the semiconductor layers 110 are removed while the semiconductor layers 120 are only minimally affected. The optimal condition may be reached by additionally adjusting the etching temperature, dopant concentration, as well as other experimental parameters. In another embodiment, the semiconductor layers 120 include SiGe and the semiconductor layers 110 includes Si. A cryogenic deep reactive ion etching (DRIE) process may be used to selectively etch away the Si semiconductor layer 110. For example, the DRIE process may implement a sulfur hexafluoride-oxygen ($SF_6$—$O_2$) plasma. The optimal condition may be reached by adjusting the etching temperature, the power of the Inductively Coupled Plasma (ICP) power source and/or Radio Frequency (RF) power source, the ratio between the $SF_6$ concentration and the $O_2$ concentration, the dopant (such as boron) concentrations, as well as other experimental parameters. For example, the etching rate of a Si semiconductor layer 110 using a $SF_6$—$O_2$ plasma (with approximately 6% $O_2$) may exceed about 8 µm/min at a temperature of about −80° C.; while the SiGe semiconductor layers 120 are not substantially affected during the process.

Figure 7:
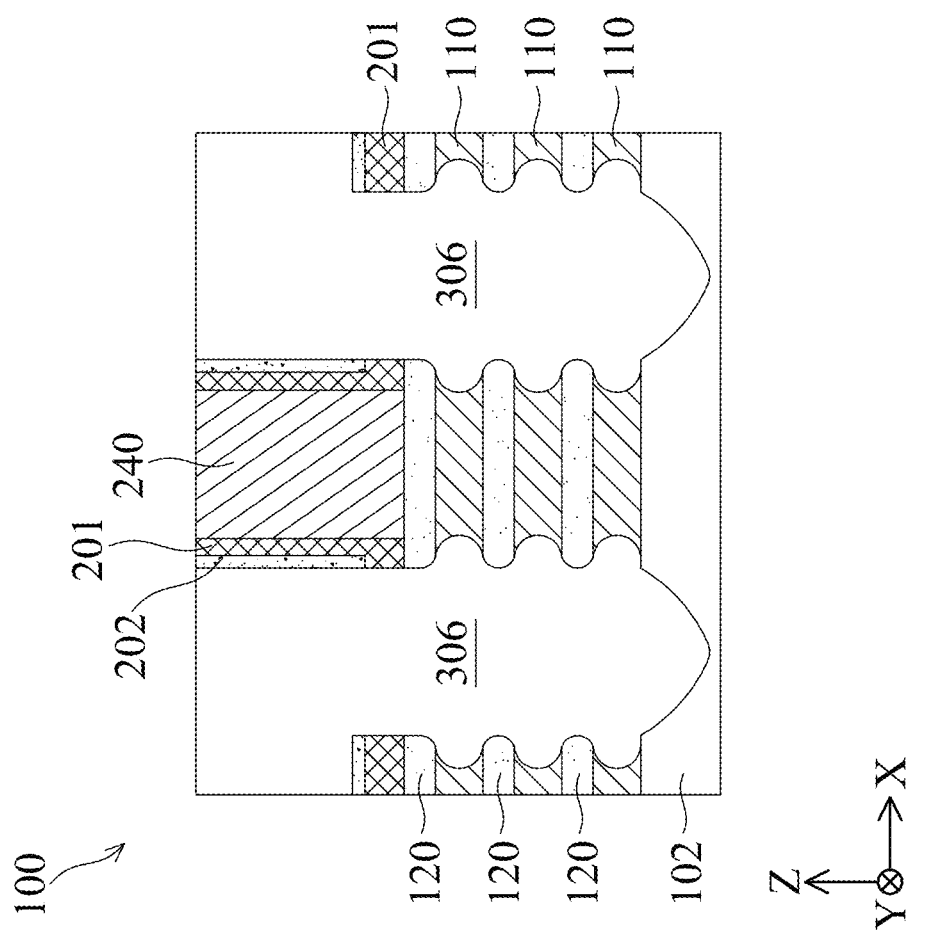

Referring to block 22 of FIG. 2B and FIG. 7, a dielectric material 306 is deposited into both the source/drain trenches 204 and the openings 205. In an embodiment, the dielectric material 306 may be selected from $SiO_2$, SION, SiOC, SiOCN, or combinations thereof. In some embodiments, the proper selection of the dielectric material may be based on its dielectric constant (as described later). The deposition of the dielectric material 306 may be any suitable methods, such as CVD, PVD, PECVD, MOCVD, ALD, PEALD, or combinations thereof. In the depicted embodiment, the dielectric material 306 may have a top surface that extends along a top surface of the gate structure 250. For example, the dielectric material 306 may be deposited to a height over the top surface of the gate structure 250, and a CMP process may be performed to planarize the top surfaces of the device, and to expose the top surfaces of the gate structure 250.

Figure 8:
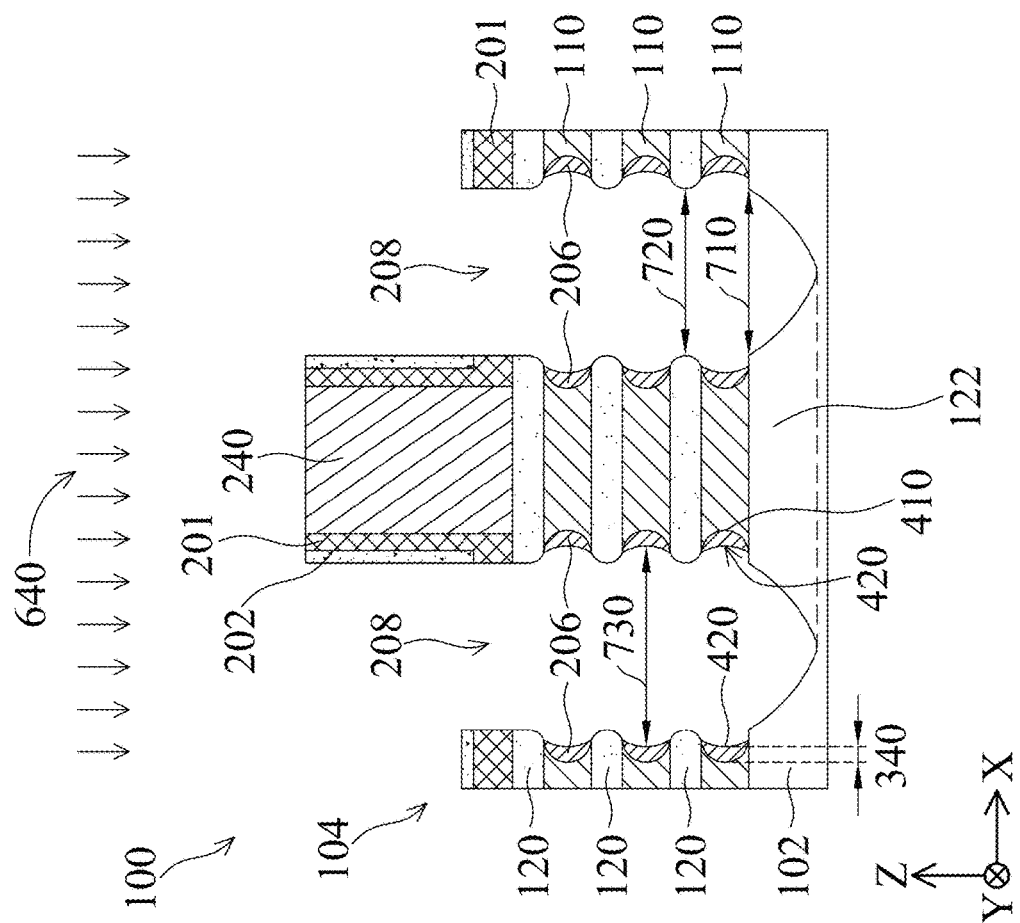

Referring to FIG. 8, the dielectric material 306 is partially etched back by process 640 to form new source/drain trenches 208. The partial etching-back completely removes the dielectric materials 306 within the original source/drain trenches 204, and removes a portion, but not all, of the dielectric materials 306 within the original openings 205 (compare FIG. 6). The dielectric materials 306 remaining in the openings 205 become the inner spacers 206. Accordingly, the inner spacers 206 are formed between vertically adjacent semiconductor layers 120. In an embodiment, the etching-back is a self-aligned anisotropic dry-etching process, such that the gate spacer layers 201 or 202 are used as the masking element. Alternatively, a different masking element (e.g. a photoresist) may be used. The inner spacers 206 interface with the remaining portions of the semiconductor layers 110 at the surface 410. Additionally, the inner spacers 206 have a new surface 420 exposed in the source/drain trenches 208. The distance between the surfaces 410 and 420 defines the lateral width 340 of the inner spacers 206. The new surface 420 may be of a same or different profile as that of the surface 410. When the surfaces 410 and 420 have different profiles, the inner spacers 206 may have varying lateral widths at different heights of the inner spacers 206 along the Z-direction. In such embodiments, the lateral width 340 represents an average lateral width of the inner spacers 206. In some embodiments, the separation 720 between the two surfaces 420 define a lateral dimension of an epitaxial layer subsequently formed in the source/drain trenches 208. The separation 730 may be greater than the separation 720. Accordingly, the epitaxial layer may have wavy profile along the sidewall of the source/drain trenches 208. In some embodiments, the separation 730 is about 50 nm to about 70 nm.

Figure 9:
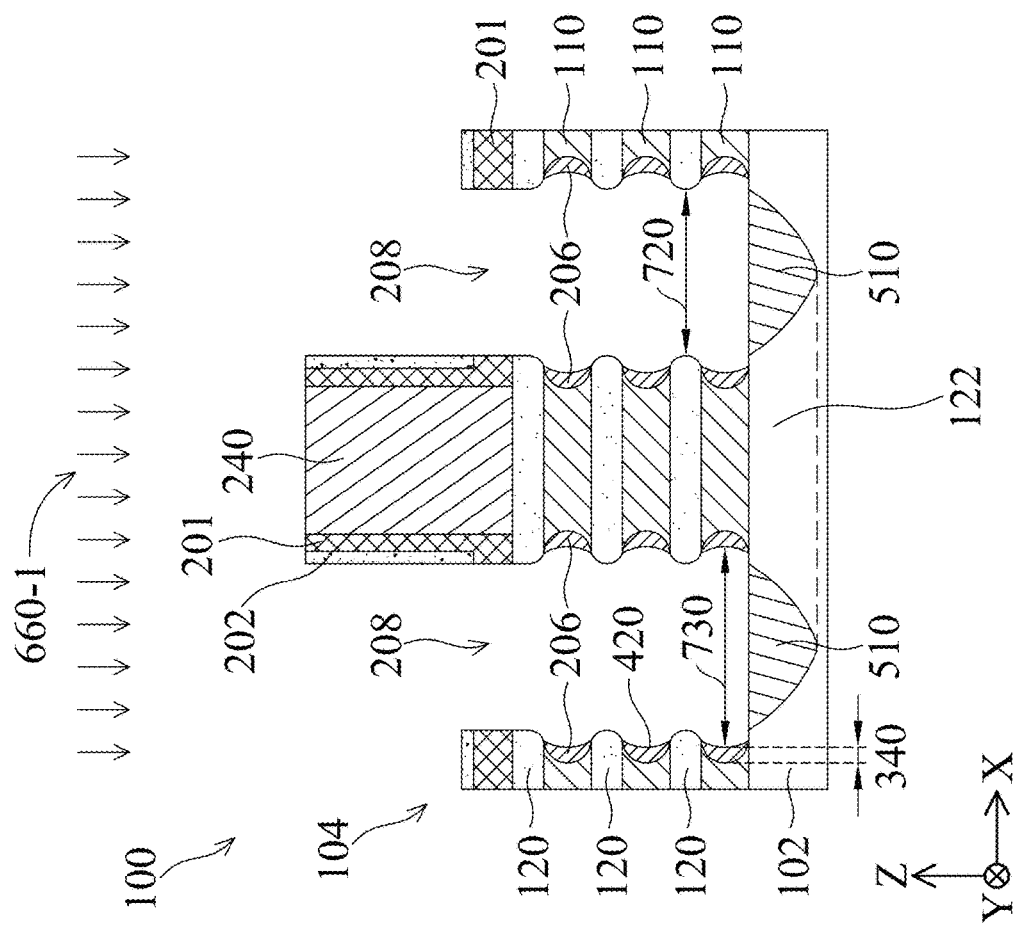
Figure 10:
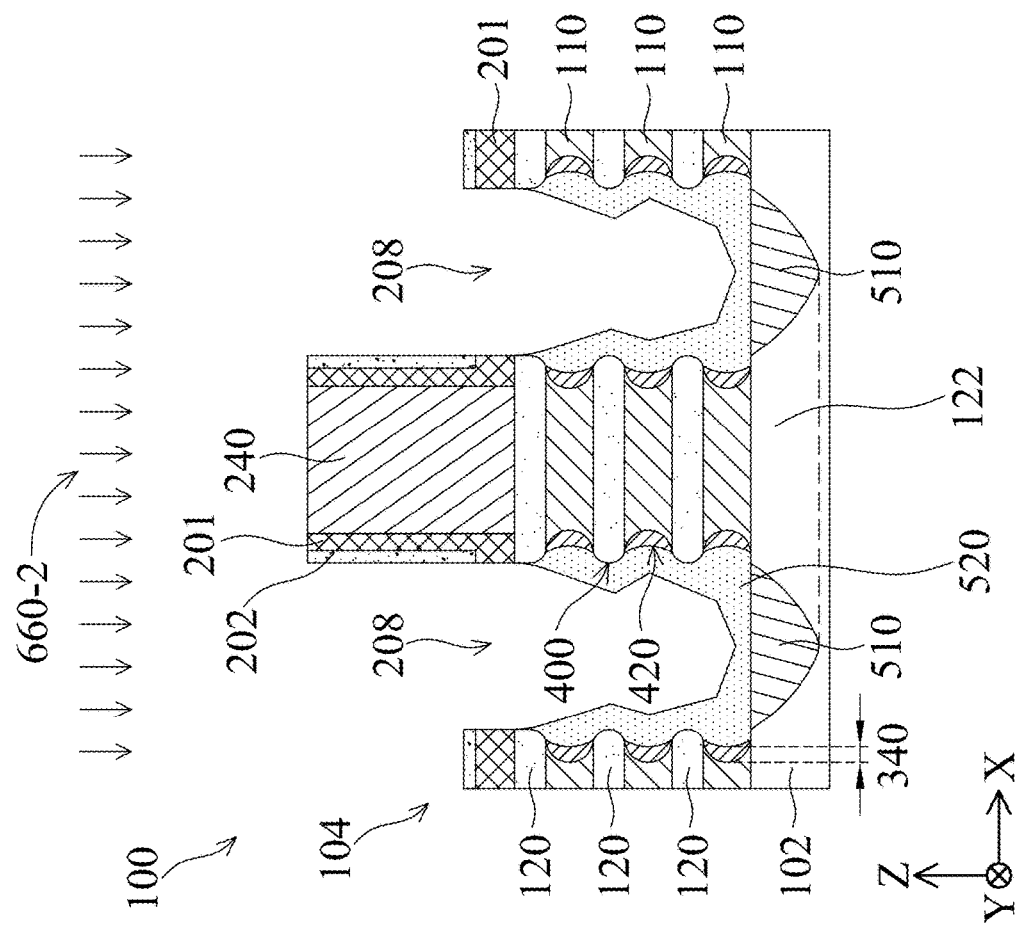
Figure 10:
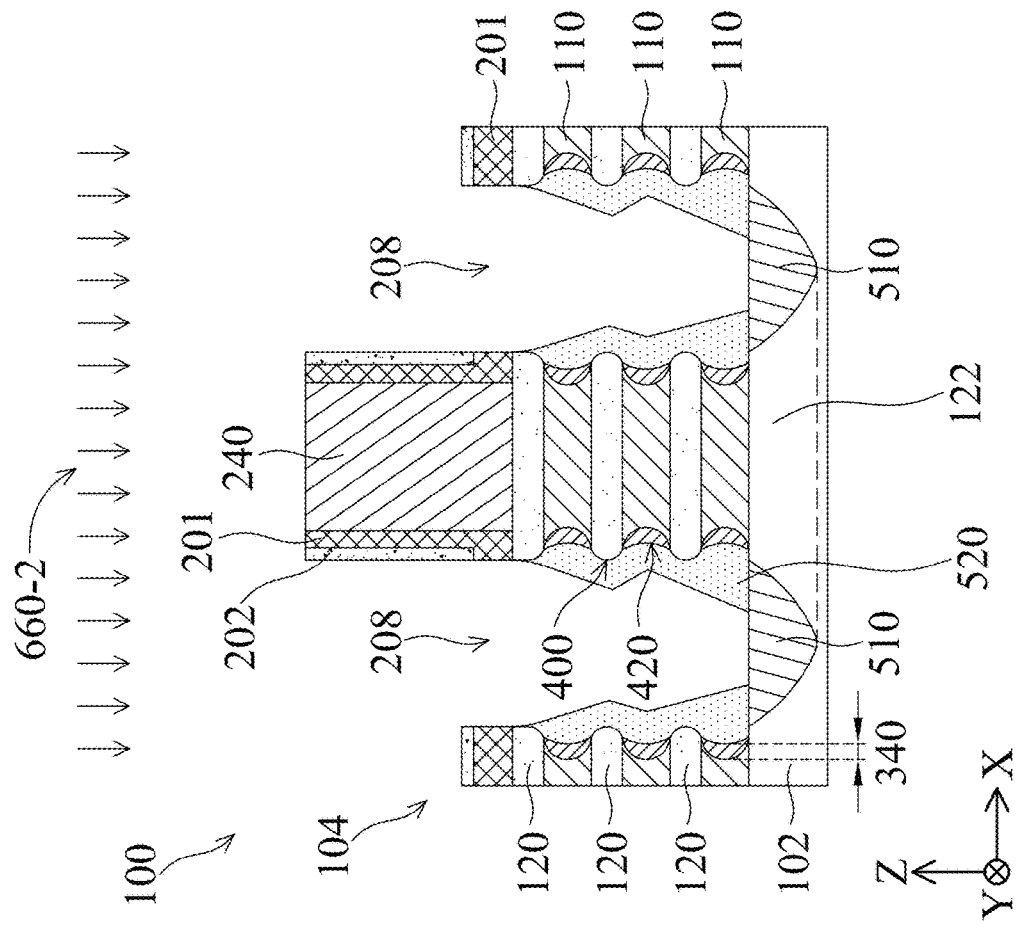
Figure 11:
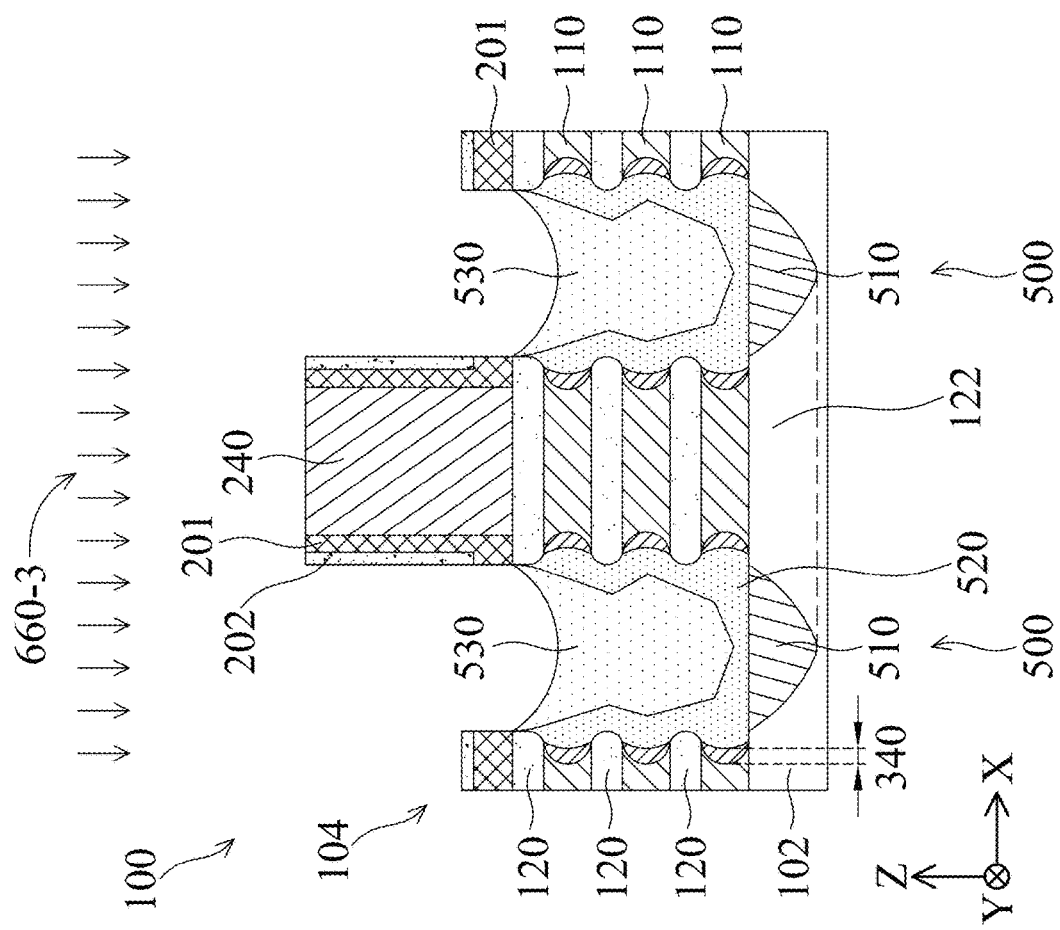
Figure 11:
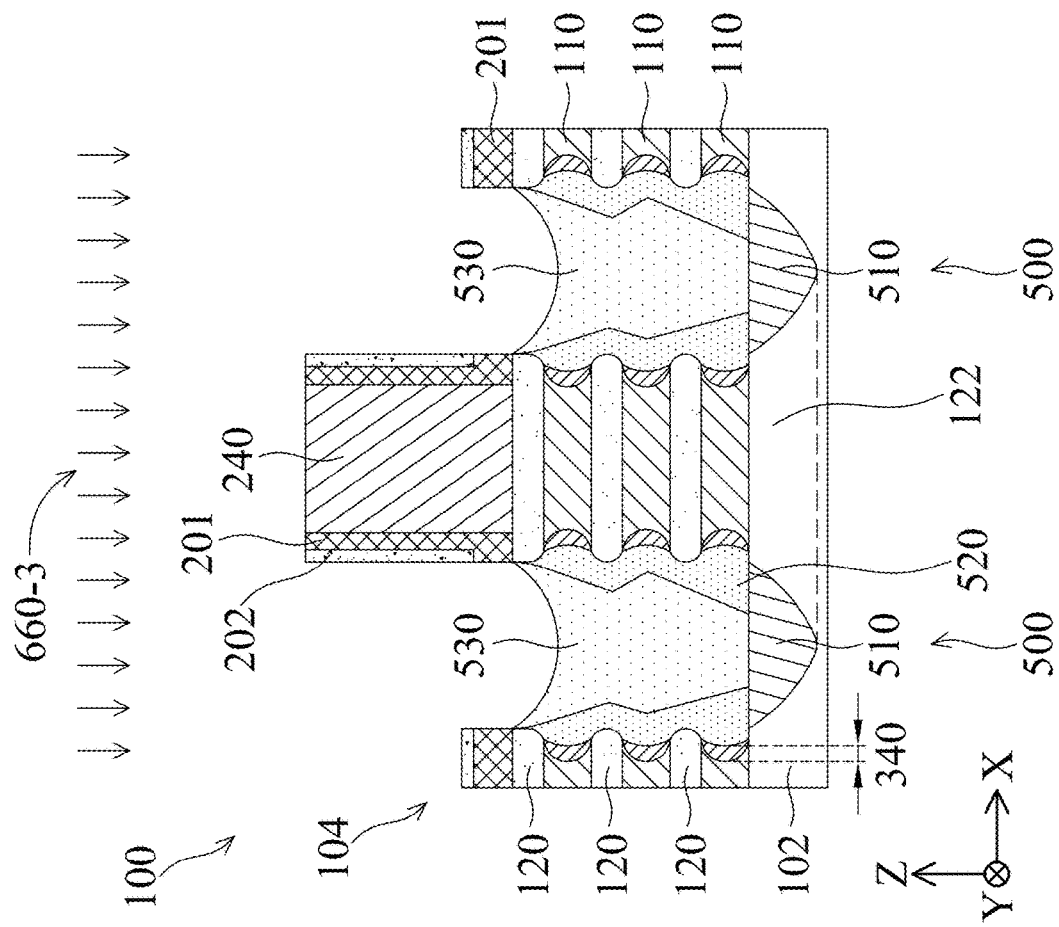

As illustrated in FIGS. 9, 10, and 11 the method 10 proceeds to forming epitaxial source/drain features 500 in the source/drain trenches 208, and at least partially fill the source/drain trenches 208. The epitaxial source/drain features 500 may include more than one layers formed in different portions of the source/drain trenches 204. In the embodiments depicted in FIG. 11, the epitaxial source/drain features 500 includes three epitaxial layers, 510, 520, and 530. The epitaxial layer 510 is first formed in the trench portion 204b (or the sub-channel portion) of the source/drain trenches 208 such that it directly interfaces with the substrates 102. The epitaxial layer 520 is then formed inside and on sidewall surfaces of the source/drain trenches 208. The epitaxial layer 520 is further formed on the top surface of the epitaxial layer 510. Furthermore, the epitaxial layer 530 is formed between portions of the epitaxial layer 520 and on sidewall surfaces of the epitaxial layer 520. In some embodiments, these epitaxial layers 510, 520, and 530 each fulfill certain different functions. The method of forming the epitaxial layers 510, 520, and 530 are further described below.

Referring to block 24 of FIG. 2B and FIG. 9, epitaxial layers 510 are formed in the source/drain trenches 208 via epitaxial process 660-1. The epitaxial process 660-1 may include performing an epitaxial deposition/partial etch process and repeating the epitaxial deposition/partial etch process. Accordingly, the epitaxial process 660-1 is a cyclic deposition/etch (CDE) process. Details of the CDE process has been described in U.S. Pat. No. 8,900,958 titled "Epitaxial formation mechanisms of source and drain regions" by Tsai and Liu, which is herein incorporated in its entirety for reference. Briefly, the deposition operation of the epitaxial process 660-1 may implement gaseous or liquid precursors. The precursors may interact with the semiconductor materials of the substrate 102, thereby forming a semiconductor epitaxy. In some embodiments, the deposition operation may use chemical vapor deposition (CVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. Then, an etching operation (such as a dry etching operation utilizing a halogen-based etching chemical) is conducted to remove amorphous semiconductor materials from the surface of the semiconductor epitaxy. In some embodiments, the etching operation also removes portions of the semiconductor epitaxy that include dislocations or other defects. Subsequently, another deposition operation is conducted to further grow and increase the thickness of the semiconductor epitaxy. The parameters of the etching and deposition operations (such as temperatures, duration, and etching chemical compositions) may be adjusted based on the desired feature profile, dimensions, or other characteristics. The cyclic process is repeated until a desired thickness of the epitaxial layer 510 is reached. In some embodiments, the epitaxial process 660-1 may instead be a selective epitaxial growth (SEG) process. The selective epitaxial growth process utilizes simultaneous deposition and etch operations. In some embodiments, the epitaxial process 600-1 may include both CDE operations and SEG operations.

In some embodiments, the epitaxial process 660-1 proceeds until the trench portions 204b is filled entirely. In other words, the epitaxial layers 510 has a top surface that extends along a top surface of the substrate 102. As described above and further explained later, it may be desirable to reduce the mobility of the charge carriers in this region (e.g. the sub-channel region) in order to reduce leakage current. In the depicted embodiments, the device 100 is configured as an n-type device. Accordingly, the epitaxial source/drain features 500 and the epitaxial layers 510 include n-type semiconductor materials, such as silicon. Therefore, the epitaxial processes 660-1 may implement at least one silicon-containing precursor, such as silane ($SiH_4$), disilane ($Si_2H_6$), trisilane ($Si_3H_8$), dichlorosilane ($SiH_2Cl_2$), another silicon-containing precursor, or any combinations thereof. Furthermore, the epitaxial layers 510 includes a dopant element. The dopant element is selected to reduce (or minimize) the mobility of the charge carrier (here, electrons) in the epitaxial layers 510.

In some embodiments, the electron mobility in a particular epitaxial material (here, Si for NMOS) is largely determined by the identity of dopant element and the concentration of the dopant element in the epitaxial material. In some embodiments, the epitaxial layers 510 is doped with carbon (C). In other words, the epitaxial layers 510 are epitaxially grown silicon:carbon (Si:C) source/drain layers. Carbon has a valence structure similar to that of the silicon, and therefore does not excessively increase the charge carrier mobility (or electron mobility) in the epitaxial layers 510. Furthermore, the C dopant also reduces out-diffusion of other dopants that may co-exist in the epitaxial layer 510. Accordingly, C may be more suitable than other n-type dopants that provide greater charge carrier mobilities. The dopant may be introduced by dosing a C-containing precursor along with the Si-containing precursors during the epitaxial process 660-1. For example, methane, ethane, monomethylsilane, other suitable C-containing precursor, or combinations thereof may be introduced into the deposition operations of the epitaxial processes 660-1. The dosage of the C-containing precursor may be adjusted throughout the epitaxial process 660-1 to achieve the desired dopant profile. In some embodiments, the C-containing precursor may be dosed at a percentage of about 10% to about 30% by volume. If the percentage is too low (such as less than 10%) or too high (such as higher than 30%), the targeted C concentration may not be achieved. The epitaxial layers 510 may include any suitable dopant profiles. Alternatively, the dopant may be introduced after the formation of the epitaxial layers 510 and by an implanting process (such as a tilt-angle ion implantation process), a diffusion process, or combinations thereof. In some embodiments, the concentration of the C dopant in the epitaxial layers 510 is less than about $1 \times 10^{18}$ atoms per cubic centimeters ($cm^3$).

In some embodiments, annealing operations are performed to cure any defects produced during the doping or deposition process. In some embodiments, annealing operations are performed to activate the dopant element. The annealing process may be rapid thermal annealing (RTA) process, a laser annealing process, other suitable annealing process, or combinations thereof.

As described above, the epitaxial layer 510 may be configured to have a top surface that extends along the top surface of the substrate 102 or slightly above the top surface of the substrate 102. In other words, the epitaxial layers 510 fully occupy the sub-channel region of the source/drain trenches 208. In various embodiments, the top surface of the epitaxial layer 510 is disposed at or above the top surface of the substrate 102 and at or below the bottom surface of the lowest semiconductor layer 120. If the epitaxial layer 510 has a top surface that is too high, such as higher than the bottom surface of the lowest semiconductor layer 120, at least a portion of the subsequently formed channel layer may interface directly with the epitaxial layer 510. Such channel layers may be a functional channel layer to transport charge carriers during device operations. Accordingly, having the functional channel layer bridging two epitaxial layers 510 that have reduced charge carrier mobility may undesirably reduce the maximum available current. Accordingly, the device speeds may be unnecessarily reduced. Conversely, if the epitaxial layer 510 has a top surface that is too low, such as lower than the top surface of the substrate 102, subsequently formed epitaxial layers 520 (or 530) may occupy a top portion of the sub-channel region. In that regard, the sub-channel regions are interposed by a portion of substrate below the lowest semiconductor layer 120 (or the channel layers 120). This portion of substrate may also function as a channel during the operation, and is therefore referred to herein as the bottom channel 122. However, the gate control of this portion is substantially weaker than that of the suspended channel layers 120 (which are entirely surrounded by portions of the gate structures 250). Accordingly, charge migrations between the sub-channel regions through this portion of substrate may undesirably occur even when the device is switched off (e.g. when there is no applied voltage or when the applied voltage is below the threshold voltage). In other words, current leakage may occur. Therefore, it may be desirable to avoid forming epitaxial features with high charge carrier mobility (such as epitaxial layers 520 or 530) in the sub-channel regions. In other words, it may be desirable to entirely fill the sub-channel region of the source/drain trenches 208. In some embodiments, the epitaxial layers 510 do not interface with the inner spacers 206. Sidewall surfaces of the inner spacers 206 remain exposed in the source/drain trenches 208 at this processing stage.

Referring to block of 26 of FIG. 2B and to FIG. 10, epitaxial layers 520 are formed on top surface of the epitaxial layers 510. Moreover, the epitaxial layers 520 are formed on sidewall surfaces of the source/drain trenches 208. For example, as described above, semiconductor layers 120 and the inner spacers 206 are exposed on the sidewall surfaces of the source/drain trenches 208. Accordingly, the epitaxial layers 520 are formed to directly interface with the semiconductor layers 120. In some embodiments, the epitaxial layers 520 further directly interface with the inner spacers 206. As described above, the sidewall surfaces of the semiconductor layers 120 may be a convex surface 400 that faces the source/drain trenches 208, while the inner spacers 206 have concaved sidewall surfaces (such as surfaces 420) that face the source/drain trenches 208. Accordingly, the sidewall surface of the epitaxial layers 520 have a plurality of convex and concave segments (or "S"-shaped portions) facing the source/drain trenches 208. In other words, each of the sidewall surfaces of the epitaxial layers 520 may have a wavy profile.

In the depicted embodiments, the epitaxial layers 520 do not entirely fill the source/drain trenches 208. Rather, the epitaxial layers 520 form a "U"-shaped layer on sidewall surfaces of the source/drain trenches 208 and on top surface of the epitaxial layers 510. In such embodiments, the epitaxial layers 520 has a continuous bottom surface that extend from one sidewall surface of the source/drain trench 208 to the opposing sidewall surface of the source/drain trench 208. In some embodiments, the epitaxial layers 520 has a bottom surface that extends below the bottom surface of the lowest semiconductor layers 120. The two prongs of the "U" each directly interfaces with the semiconductor layers 120 and further directly interfaces with the inner spacers 206. In some embodiments, the top surface of the epitaxial layers 520 reaches or extends beyond a top surface of the topmost semiconductor layers 120. For example, the sidewall surfaces of the epitaxial layers 520 may be aligned with an edge of the spacers layers 202. In some embodiments, the two prongs of the "U" have varying thicknesses along its profile (in other words, the epitaxial layers 520 are not a conformal layer in such embodiments). In some embodiments, the epitaxial layers 520 may have reduced lateral thickness along the X-direction at the top surface. For example, in the depicted embodiment of FIG. 10, the epitaxial layers 520 have a lateral thickness along the X-direction that is less than 5 nm at the height extending along the top surface of the highest semiconductor layers 120. Alternative to the continuous "V"-shaped profile of FIG. 10, referring to FIG. 10', the epitaxial layers 520 may have two separate (disconnected) prongs that are disconnected on top surfaces of the epitaxial layer 510. In other words, the top surface of the epitaxial layers 510 are exposed in the source/drain trenches 208 at this processing stage, on which additional epitaxial layers (such as epitaxial layers 530) may subsequently be formed.

The epitaxial layers 520 may include suitable epitaxial materials. In the depicted embodiment, the epitaxial layers 520 are configured to form part of an epitaxial source/drain features 500 of an NMOS. Accordingly, epitaxial layers 520 include epitaxial materials suitable for an NMOS, such as silicon. Moreover, the epitaxial layers 520 may be doped. The doping improves the mobility of charge carriers that may migrate from one epitaxial layer 520 through the channel layers 120 to another epitaxial layer 520. For example, the dopant may include Arsenic (As), phosphorous (P), antimony (Sb), bismuth (Bi), or combinations thereof. In some embodiments, the dopants are configured to have a type and concentration that achieves an intermedium charge carrier mobility (for example, higher than that in the epitaxial layer 510, but lower than that in the subsequently formed epitaxial layer 530). If the charge carrier mobility is too small, such as less than that in the epitaxial layer 510, the operation current of the device may be too low to achieve the desired functions; if the charge carrier mobility is too large, such as greater than that in the subsequently formed epitaxial layer 530 (as described in detail later), the charge carriers may enter the sub-channel region (such as into the epitaxial layers 510) thereby cause leakages in the weakly controlled bottom channel 122. In some embodiments, the dopants may be As. In other words, the epitaxial layers 520 are epitaxially grown silicon:arsenic (Si:As) source/drain layers. Dopant As provides intermedium range of electron mobility that is beneficial to the functioning of the epitaxial layers 520. In some embodiments, the dopants are configured to be at a concentration of about $1 \times 10^{21}$ atoms/cm$^3$ to about $3 \times 10^{21}$ atoms/cm$^3$. If the dopant concentration is too small, such as less than about $1 \times 10^{21}$ atoms/cm$^3$, or too large, such as greater than about $3 \times 10^{21}$ atom/cm$^3$, the target charge carrier mobility may not be achieved. The epitaxial layers 520 may include any suitable dopant profiles.

The epitaxial layers 520 may be formed using methods similar to those described above with respect to 510. For example, epitaxial process 660-2 may implement CDE, SEG, or combinations thereof in order to form the epitaxial layers 520. Generally, the growth of the semiconductor epitaxy initiates from surfaces of the semiconductor materials. Accordingly, the growth of the epitaxial layers 520 starts from the top surface of the epitaxial layer 510 as well as from the exposed sidewall surfaces of the semiconductor layers 120. Minimal growth occurs from the dielectric material of the inner spacers 206. However, growth from adjacent surfaces merge on sidewall surfaces of the inner spacers 206 to form continuous epitaxial layers 520. In some embodiments, the epitaxy process is terminated before the epitaxial layers 520 fill the entire source/drain trenches. The semiconductor epitaxy formed at that process stage becomes the epitaxial layer 520. In other embodiments, the epitaxy process continues to fill the entire source/drain trenches, and is subsequently etched to form an opening in the middle portion. As described above, the epitaxial layers 520 are configured to have intermediate charge carrier mobilities such that concerns for bottom leakage may be mitigated. However, it may be desirable to have additional epitaxial layers with higher charge carrier mobility in close contact with the epitaxial layers 520 such that device speeds are optimized. As detailed below, epitaxial layers 530 are so configured and formed on top and between portions of the epitaxial layers 520.

In some embodiments, the semiconductor epitaxy of the epitaxial layers 520 may be the same as that of the epitaxial layers 510. For example, the epitaxial layers 520 may include Si as the semiconductor epitaxy formed from Si-containing precursor gases. Moreover, precursors that include dopant element may be introduced during the deposition cycles of the CDE or SEG processes. For example, As-containing precursors may be introduced during the epitaxial processes 660-2. As-containing precursors include arsine ($AsH_3$), arsenic nitride ($AsN_3$), $As_xHe$, other suitable As-containing precursors, or combinations thereof. In some embodiments, the dopant precursor may be introduced at a percentage of about 10% to about 30%. If the percentage is too low (such as less than 10%) or too high (such as greater than 30%), the target concentration of the dopant may not be achieved. Alternatively, the dopant element may be introduced after the formation of the epitaxial layers 520, such as via an implant process (such as a tilt-angle ion implantation process) or a diffusion process. In some embodiments, annealing operations are performed to cure any defects produced during the implant process. In some embodiments, annealing operations are performed to further activate the dopant element. The annealing process may be rapid thermal annealing (RTA) process, a laser annealing process, other suitable annealing process, or combinations thereof.

Referring to block 28 of FIG. 2B and to FIG. 11, epitaxial layers 530 are formed on top and sidewall surfaces (or inner surfaces) of the epitaxial layer 520 in epitaxial processes 660-3. In some embodiments, the epitaxial layer 530 connect two opposing portions of the epitaxial layers 520 and fills at least majority portions of the remaining portions of the source/drain trenches 208. In some embodiments, the epitaxial layer 530 completely fills the source/drain trenches 208. Referring to FIG. 11', in embodiments where the epitaxial layers 520 include two separate portions that are disconnected at the top surface of the epitaxial layers 510, the epitaxial layers 530 further interfaces with the epitaxial layers 510. In some embodiments, the epitaxial layers 530 has a bottom surface that extend below the bottom surface of the lowest channel layer 120. In other words, the epitaxial layers 530 extend across the height dimension of the lowest channel layer. This may be beneficial to provide sufficient amount of charge carriers of high mobility to the lowest channel layer, thereby maximizing the available current.

The epitaxial layers 530 may include semiconductor epitaxy that are the same or similar to those of the epitaxial layers 510 and 520. For example, in the depicted embodiment, the epitaxial layers include Si epitaxy. Furthermore, the epitaxial layers 530 are configured with dopant structures to provide charge carriers (i.e. electrons) that have the highest mobility such that the speed of the device is maximized. Accordingly, the epitaxial layers 530 have a dopant structure that provides charge carrier mobility that exceeds that of the epitaxial layers 520 and epitaxial layers 510. The epitaxial layers 530 may include an n-type dopant, such as P, As, Bi, Sb, or combinations thereof. In some embodiments, epitaxial layers 530 may include a same dopant as the epitaxial layers 520. For example, both the epitaxial layers 520 and 530 include P. In other words, both epitaxial layers 520 and 530 may be epitaxial silicon:phosphor (Si:P) source/drain layers. In some embodiments, the epitaxial layers 530 may include the dopant at different concentrations to achieve the different charge carrier mobility. As described above, the epitaxial layers 520 may include the dopant at a concentration of $1\times10^{21}$ atoms/$cm^3$ to about $3\times10^{21}$ atoms/$cm^3$. The epitaxial layers 530 may include the dopant at a concentration of $1\times10^{21}$ atoms/$cm^3$ to about $8\times10^{21}$ atoms/$cm^3$. If the dopant concentration is too small, such as less than about $1\times10^{21}$ atoms/$cm^3$, the operation current may be unnecessarily limited; if the dopant concentration is too large, such as greater than about $8\times10^{21}$ atom/$cm^3$, leakages may result or the increase in speed may saturate. In some embodiments, both epitaxial layers 520 and 530 include the same dopant, and the ratio of the dopant concentration in the epitaxial layers 530 to that in the epitaxial layers 520 may be about 1:1 to about 5:1. If the ratio is too small (such as less than 1:1) or too large (such as larger than 5:1), the balance between the charge carrier mobilities described above may not be achieved. In some embodiments, both the epitaxial layers 520 and 530 may include As thereby forming epitaxial silicon:arsenic (Si:As) source/drain layers. In some embodiments, the epitaxial layers 530 may include a different dopant from the epitaxial layers 520. For example, the epitaxial layers 520 may include As, while the epitaxial layers 530 may include P. In some embodiments, P provides greater charge carrier (here, electron) mobility than As does.

The epitaxial layers 530 may be formed using similar methods as those described above for the epitaxial layers 510 and 520. For example, CDE, SEG, or combinations thereof may be used. Additionally, precursors that include dopant element may be introduced during the deposition cycles of the CDE or SEG processes. For example, P-containing precursors include phosphine ($PH_3$), phosphorous nitride ($PN_3$), phosphorous fluoride ($PF_2$), PxHe, other suitable P-containing precursors, or combinations thereof. In some embodiments, the dopant precursor may be introduced at a percentage of about 30% to about 80%. If the percentage is too low (such as less than 30%) or too high (such as greater than 80%), the target concentration of the dopant may not be achieved. Alternatively, the dopant element may be introduced after the formation of the epitaxial layers 530, such as via an implant process (such as a tilt-angle ion implantation process) or a diffusion process. In some embodiments, annealing operations are performed to cure any defects produced during the implant process. In some embodiments, annealing operations are performed to activate the dopant element. The annealing process may be rapid thermal annealing (RTA) process, a laser annealing process, other suitable annealing process, or combinations thereof.

As described, there exists a charge carrier mobility cascade between adjacent epitaxial layers 510, 520, and 530. While the disclosure above describes each of the three epitaxial layers having a single dopant element, in some embodiments, combinations of dopant elements may be used in order to achieve the desired mobility cascade. For example, one or more of the epitaxial layers 510, 520, and 530 may be doped with both C and As, both As and P, or both C and P to achieve the described mobility cascade. Moreover, additionally or alternatively, the epitaxial layers 510, 520, and 530 may include the same or different dopant(s) at different concentrations (such as atomic percentages) in order to achieve the described mobility cascade. This present disclosure contemplates any dopant structure that achieves the described mobility cascade.

As illustrated in FIG. 11, each pair of epitaxial layers 520 (hence also the epitaxial source/drain features 500) are connected by multiple semiconductor layers 120, which serve as the charge carrier conduit (or channel layers) between the source side and the drain side during the operation. For example, when the device 100 is switched on (e.g. when the voltage applied to its gate electrode exceeds the threshold voltage), the semiconductor layers 120 electrically connects (or bridges) the epitaxial layers 520 to allow current to be formed. Meanwhile, while the epitaxial layers 530 are physically spaced away from the semiconductor layers 120, they become electrically connected to the semiconductor layers 120 through the epitaxial layers 520. For example, charge carriers migrate from the epitaxial layers 530 on the source side through the epitaxial layers 520 into the semiconductor layers 120, and further from the semiconductor layers 120 through the epitaxial layers 520 into the epitaxial layers 530 on drain side. Because the mobility of charge carriers in the epitaxial layers 530 is higher than that in the epitaxial layers 520, the epitaxial layers 530 may predominately contribute to the overall charge migrations. Meanwhile, because charge carriers in the epitaxial layer 510 has significantly reduced mobility, its contribution to the current may be small (such as negligible).

Moreover, because the semiconductor layers 120 are each surrounded by a portion of the gate structure (described in detail later) in 360°, they are subject to effective gate controls. Accordingly, when the device 100 is switched off, these channel layers are effectively shut off. There may be minimal (or no) charge carriers travelling through the semiconductor layers 120 between the epitaxial layers 520 and 530 despite them being physically adjacent or connected to the semiconductor layers 120. Meanwhile, the bottom channel 122 may be under weak gate control. It is physically separated from the epitaxial layers 520 and 530 and not affected by the high charge carrier mobility of these features. Additionally, the immediately connected epitaxial layers 510 have limited charge carrier mobility. Accordingly, there may be minimal (or no) charge carrier transportation through the bottom channel 122 or any channel layers 120. Leakage current is thereby minimized.

In some embodiments, the epitaxial layers 530 are omitted, and that the epitaxial layers 520 further occupy the space described above for epitaxial layers 530. While there may be increased leakage current in such embodiments, there may be benefit of reducing fabrication costs associated with having one less epitaxial layer.

Figure 12:
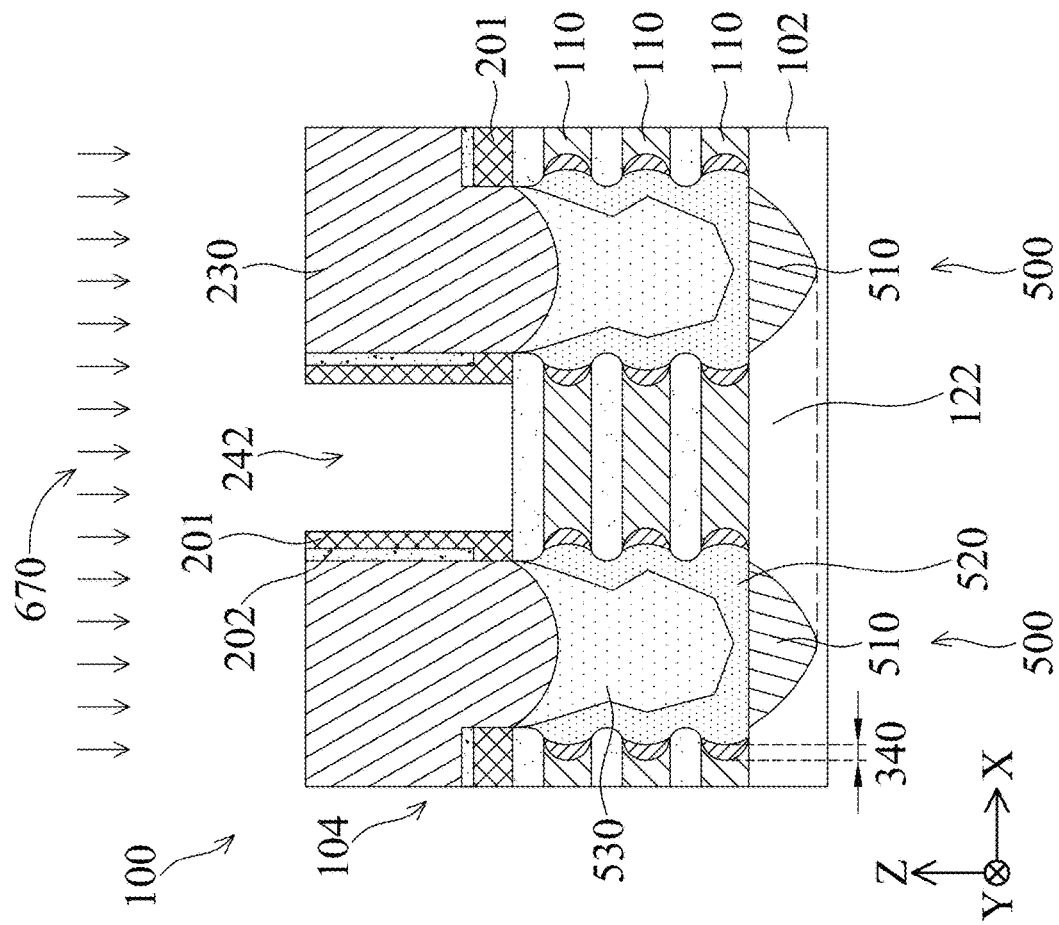

Referring to FIG. 12, an interlayer dielectric (ILD) layer 230 is formed over the epitaxial source/drain features 500, as well as vertically over the isolation features 150. In some embodiments, an etch-stop layer 220 may be formed in between the ILD layer 230 and the source/drain features 500. The ILD layer 230 may also be formed in between the adjacent gate structures 250 along the X-direction, and in between the adjacent epitaxial source/drain features 500 along the Y-direction. The ILD layer 230 may include a dielectric material, such as a high-k material, a low-k material, or an extreme low-k material. For example, the ILD layer 230 may include $SiO_2$, SiOC, SiON, or combinations thereof. The ILD layer 230 may include a single layer or multiple layers, and may be formed by a suitable technique, such as CVD, ALD, and/or spin-on techniques. After forming the ILD layer 230, a CMP process may be performed to remove excessive ILD layer 230 and planarized the top surface of the ILD layer 230. Among other functions, the ILD layer 230 provides electrical isolation between the various components of the device 100.

Referring to block 30 of FIG. 2B and FIG. 12, the dummy gate stacks 240 are selectively removed in process 670. The removal of the dummy gate stacks 240 creates gate trenches 242, which expose the respective top surfaces and the side surfaces of the semiconductor stacks (along the Y direction). The processes 670 may be selected from any suitable lithography and etching processes. In some embodiments, the lithography process may include forming a photoresist layer (resist), exposing the resist to a patterned radiation, performing a post-exposure bake process, and developing the resist to form a masking element, which exposes a region including the gate structures 250. Then, the dummy gate stacks 240 are selectively etched through the masking element. In some other embodiments, the gate spacer layers 201 and/or 202 may be used as the masking element or a part thereof.

Figure 13:
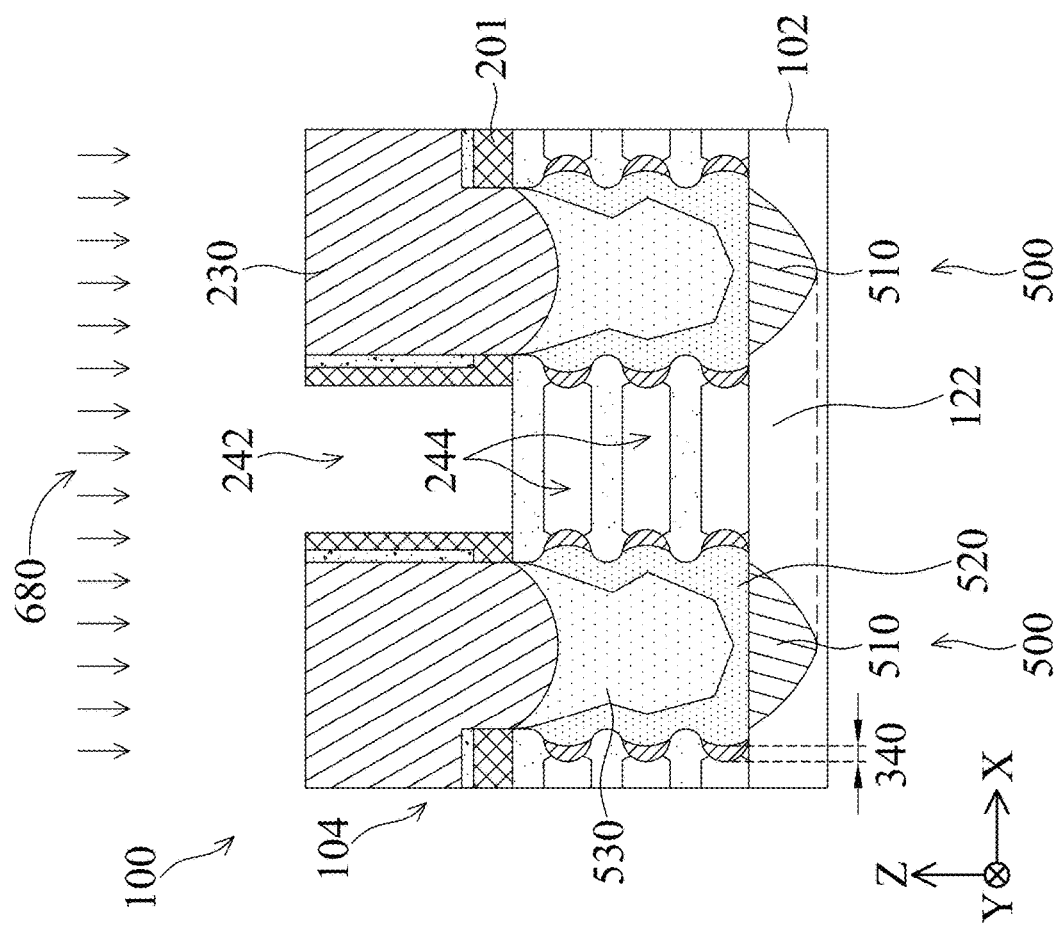

Referring to blocks 32 of FIG. 2B and FIG. 13, the remaining portions of the semiconductor layers 110 are selectively removed during process 680 through the exposed side surfaces of the semiconductor stack. Similar to processes 620, process 680 may be configured to completely remove the semiconductor layers 110 without substantially affect the semiconductor layers 120. Nevertheless, the semiconductor layers 120 may be slightly affected during the processes 680. For example, the center of the semiconductor layers 120 may have their thicknesses reduced by about 1% to about 10%. Additionally, the portion of substrate 102 in the channel region may similarly be recessed by about 1% to about 10%. Meanwhile, the end portions of the semiconductor layers 120 directly above and below the inner spacers 206 are not affected due to the protection from the inner spacers 206. Those end portions of semiconductor layers 120 are surrounded on three sides by the epitaxial layers 520 as well as the inner spacers 206. Accordingly, end portions of the semiconductor layers 120 may have greater thickness (along the Z-direction) than the middle portions of the semiconductor layer 120. In other words, the semiconductor layers 120 now have a dog-bone profile. The removal of the remaining portions of the semiconductor layers 110 form suspended semiconductor layers 120, as well as openings 244 in between the vertically adjacent semiconductor layers 120. Accordingly, the center portions of the semiconductor layers 120 each have exposed top, bottom, and sidewall surfaces. In other words, the center portions of each of the semiconductor layers 120 are now exposed circumferentially around the X-direction. The processes 680 may be any suitable etching processes, such as a dry etching process, a wet etching process, or combinations thereof. In addition to exposing top and bottom surfaces of the center portions of the semiconductor layers 120, the processes 680 also expose the sidewall surfaces 460 of the inner spacers 206.

Figure 14:
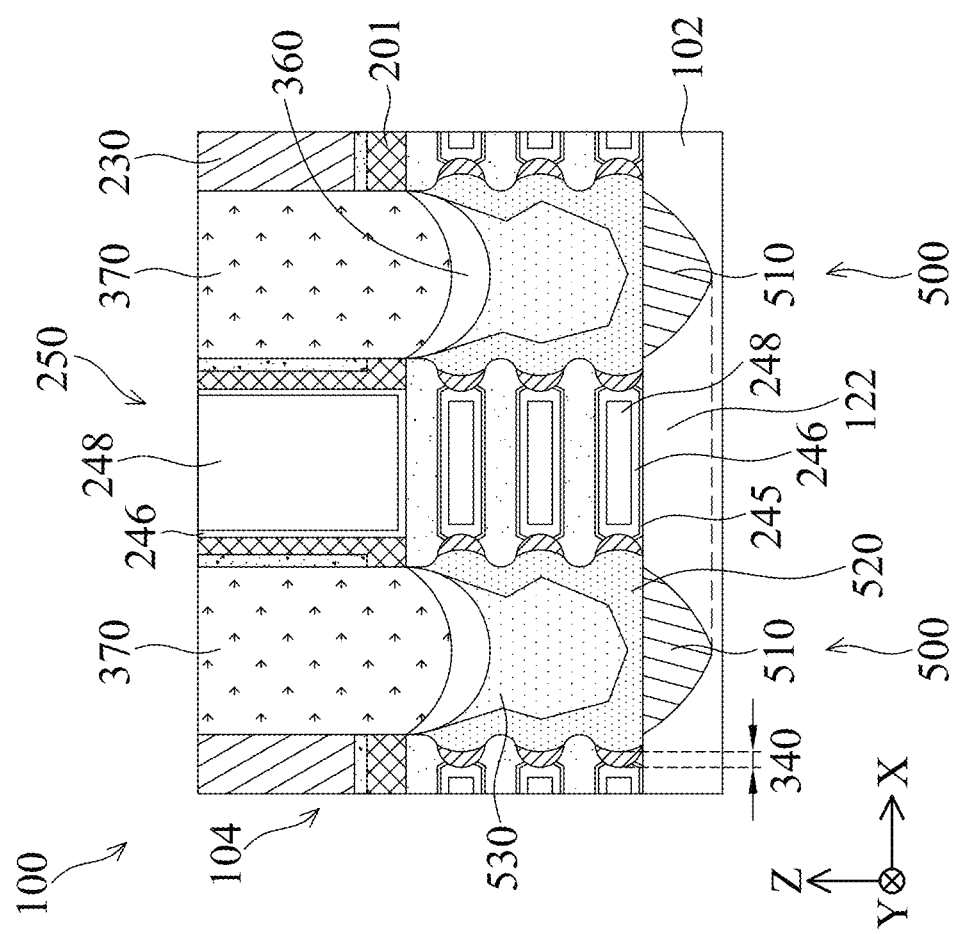

Referring to block 34 of FIG. 2B and FIG. 14, metal gate stacks are formed in the openings 244 and the gate trenches 242. For example, a gate dielectric layer 246 is formed over and between the semiconductor layers 120, and a conductive metal layer 248 is formed over and between the portions of the gate dielectric layers 246. In some embodiments, the gate dielectric layer 246 may be a high-k dielectric layer. The high-k gate dielectric layer 246 may be formed conformally such that it at least partially fills the gate trenches 242 and the openings 244. In some embodiments, the high-k gate dielectric layer 246 may be formed around the exposed surfaces of each of the semiconductor layers 120, such that it wraps around each of the semiconductor layers 120 in 360°. The high-k gate dielectric layer 246 may further be formed over the side surfaces of the inner spacers 206, and the gate spacer layers 201. The high-k gate dielectric layer 246 may contain a dielectric material having a dielectric constant greater than a dielectric constant of $SiO_2$, which is approximately 3.9. For example, the high-k gate dielectric layer may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layer 246 may be by any suitable processes, such as CVD, PVD, ALD, or combinations thereof.

In some embodiments, an interfacial layer 245 is formed to interpose between the semiconductor layers 120 and the gate dielectric layers 246. Any suitable methods may be used to form the interfacial layer, such as ALD, CVD, or other deposition methods. Alternatively, the interfacial layer 245 may also be formed by an oxidation process, such as thermal oxidation or chemical oxidation. In this instance, no interfacial layer is formed on the sidewalls of the inner spacers 206 or the gate spacer layers 201. In many embodiments, the interfacial layer 245 improves the adhesion between the semiconductor substrate and the subsequently formed high-k dielectric layer 246. However, in some embodiments, the interfacial layer 245 is omitted.

The conductive metal layer 248 is formed over the gate dielectric layer 246 and fills the remaining spaces of the gate trenches 242 and the openings 244. The conductive metal layer 248 may include a work function metal layer. In the depicted embodiment, the conductive metal layer 248 is configured for the NMOS transistor. Accordingly, the work function metal layer may include any suitable n-type work function metal materials, such as titanium nitride (TiN), ruthenium (Ru), iridium (Ir), osmium (Os), rhodium (Rh), or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 230. The gate dielectric layer 246 and the conductive metal layer 248 collectively form the high-k metal gate stack. The high-k metal gate stack and the gate spacer layers 201 and 202 collectively form the new gate structures 250. The gate structures 250 engage multiple semiconductor layers 120 to form multiple gate channels.

Referring to block 36 of FIG. 2B and to FIG. 14, contact trenches are formed over the epitaxial source/drain features 500 in the ILD layer 230. Subsequently, a silicide feature 360 (or silicide layer 360) is formed in the contact trench and on the epitaxial source/drain features 500. Silicide features 360 may reduce Schottky barrier height and thereby reduce the contact resistances between the source/drain features and the subsequently formed contact features. In the depicted embodiments, the silicide features 360 interface with the epitaxial layers 530 at its bottom surface, and interface with the epitaxial layers 520 with its sidewall surfaces. Moreover, the silicide features 360 is spaced away from the epitaxial layers 510. The silicide features 360 may be formed using any suitable methods, such as self-aligned silicide method, other suitable methods, or combinations thereof. In some embodiments, the silicide features 360 have a concave surface. In some embodiments, the silicide features 360 are omitted. Furthermore, source/drain contacts 370 are formed over the silicide features 360. The source/drain contacts 370 may include any suitable contact materials, such as tungsten (W), cobalt (Co), aluminum (Al), copper (Cu), or combinations thereof.

The disclosure above describes forming an NMOS device 100 with improved dopant structures that reduce leakage current and parasitic resistances. In some embodiments, the device 100 may alternatively be a PMOS device. In such embodiments, the epitaxial layers 510, 520, and 530 may have similar physical dimensions and parameters as described above with respect to the NMOS device 100. Moreover, the dopant structures may similarly be configured to minimize the charge carrier mobility in the epitaxial layers 510, to maximize the charge carrier mobility in the epitaxial layers 530, and to have intermedium charge carrier mobility in the epitaxial layers 520. However, in the case of PMOS devices, the charge carriers are holes rather than electrons. Furthermore, the base material for the charge carriers to migrate within, that is, epitaxial layers 510, 520, and 530 may be different from that in the NMOS device 100. For example, the epitaxial layers 510, 520, and 530 may include suitable p-type semiconductor epitaxy materials, such as Si, silicon germanium (SiGe), germanium (Ge), or combinations thereof. In some embodiments, the epitaxial layers 510, 520, and 530 may include a p-type dopant, such as boron (B), boron fluoride ($BF_2$), gallium (Ga), other suitable p-type dopants, or combinations thereof. In some embodiments, the epitaxial layers 510 for a p-type device may include a carbon (C) dopant at a concentration of about $5\times10^{17}$ atoms/$cm^3$ to about $1\times10^{18}$ atoms/$cm^3$; epitaxial layers 520 for a p-type device may include a boron (B) dopant at a concentration of about $1\times10^{21}$ atoms/$cm^3$ to about $5\times10^{21}$ atoms/$cm^3$; and epitaxial layers 530 for a p-type device may include a boron (B) dopant at a concentration of about $1\times10^{21}$ atoms/$cm^3$ to about $8\times10^{21}$ atoms/$cm^3$. Therefore, a charge carrier (here, hole) mobility cascade, similar to that of the electron mobility cascade described above, may be achieved. Such a configuration reduces leakage current in the PMOS device, and reduces FEOL capacitances. Additionally, this present disclosure contemplates any other dopant structures that achieve the described charge carrier mobility cascade.

Furthermore, PMOS devices include a gate structure that has similar structures to that of the gate structures 250 described above. However, the conductive metal layer 248 may include a different work function metal layer or a different fill metal layer. For example, the work function metal layer may include p-type work function metal materials, such as titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), or combinations thereof. The fill metal layer may include any suitable materials such as Al, W, Cu, Co, Ni, Pt, Ru, or combinations thereof.

In some embodiments, the device 100 may be a CMOS device having an NMOS component and a PMOS component coupled together. Accordingly, the methods described above with respect to NMOS and to PMOS may be adapted to provide a CMOS device where one or both components include features described herein. For example, FIGS. 15A-15B describe a flow chart of method 10' for forming a CMOS device 100', where at least one of the components implement the method describe above.

Figure 15A:
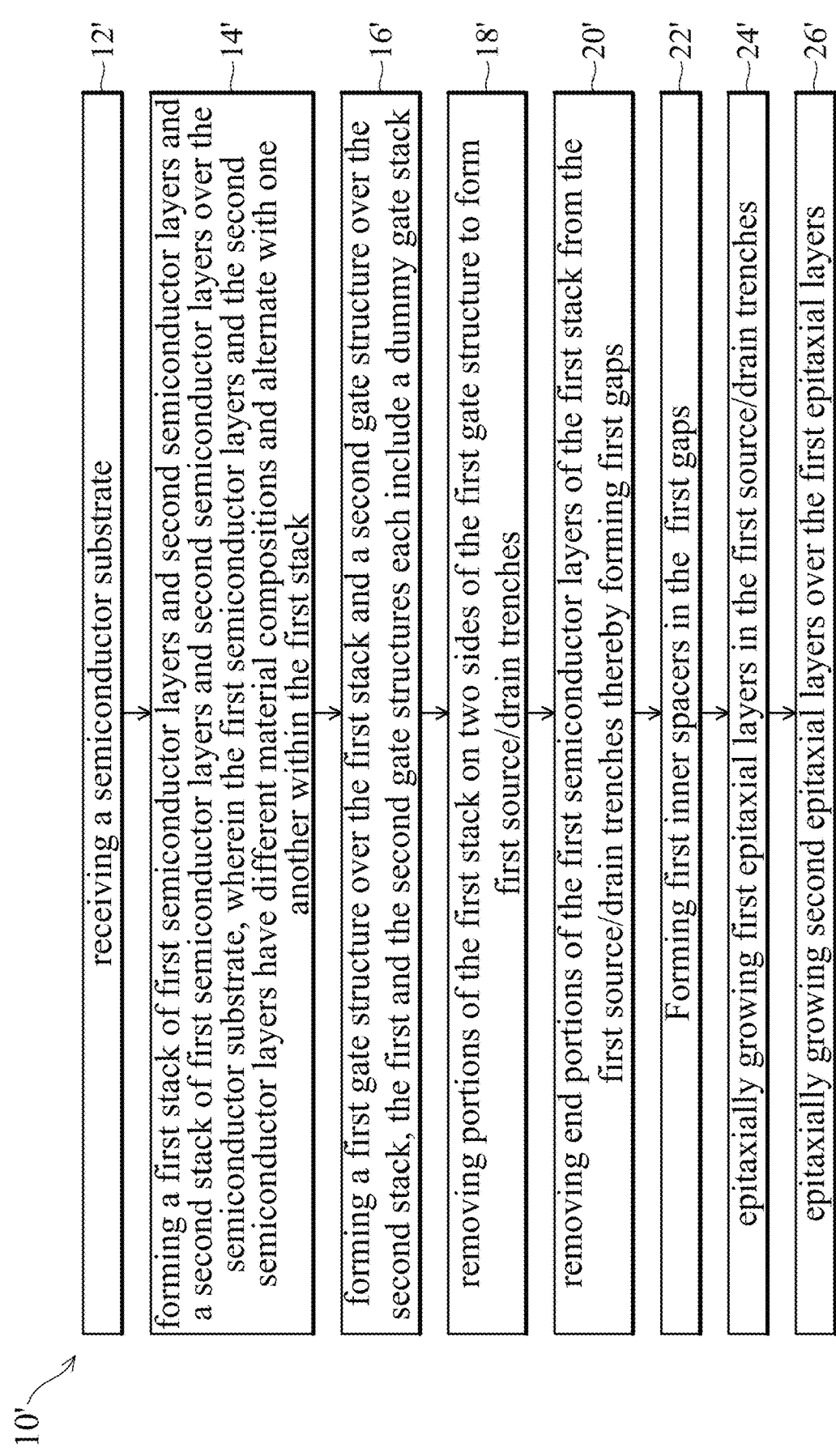

Referring to block 12' of FIG. 15A, a semiconductor substrate 102 is received. The semiconductor substrate may be similar to those described above with respect to block 12 of FIG. 2A. Referring to blocks 14', stacks of semiconductor layers are formed in different regions of the substrate. For example, a first stack of semiconductor layers is formed in a first region configured for a PMOS 100A, and a second stack of semiconductor layers is formed in a second region configured for an NMOS 100B. Each of the first and the second stacks of semiconductor layers may be similar to the stack of semiconductor layers described above with respect to the block 14 of FIG. 2A. Accordingly, the first and the second stacks of semiconductor layers each include semiconductor layers 110 and semiconductor layers 120 that have different materials and different etching rates. The semiconductor layers 110 and 120 are formed in an interleaving mode and alternate with each other in the first and the second stacks. In the depicted embodiments, the semiconductor layers 110 includes Si, and the semiconductor layers 120 includes SiGe. These stacks are patterned into fin structures 104A and 104B, respectively. Referring to blocks 16' of FIG. 15A, gate structures are formed on and wrapping the fin structures 104A and 104B, respectively. Further, a spacer layer is formed on the gate structures and the exposed surfaces of the fin structures 104A and 104B. At this processing stage, the PMOS region and the NMOS region can be processed together or separately. For example, blocks 18'-38' of the FIGS. 15A-15B describe processing the two regions separately. This allows, for example, the PMOS 100A and NMOS 100B to include asymmetric device features (such as asymmetric inner spacers). However, in some embodiments, portions of the subsequent processing steps on both regions may be performed together so as to reduce production costs.

Figure 16:
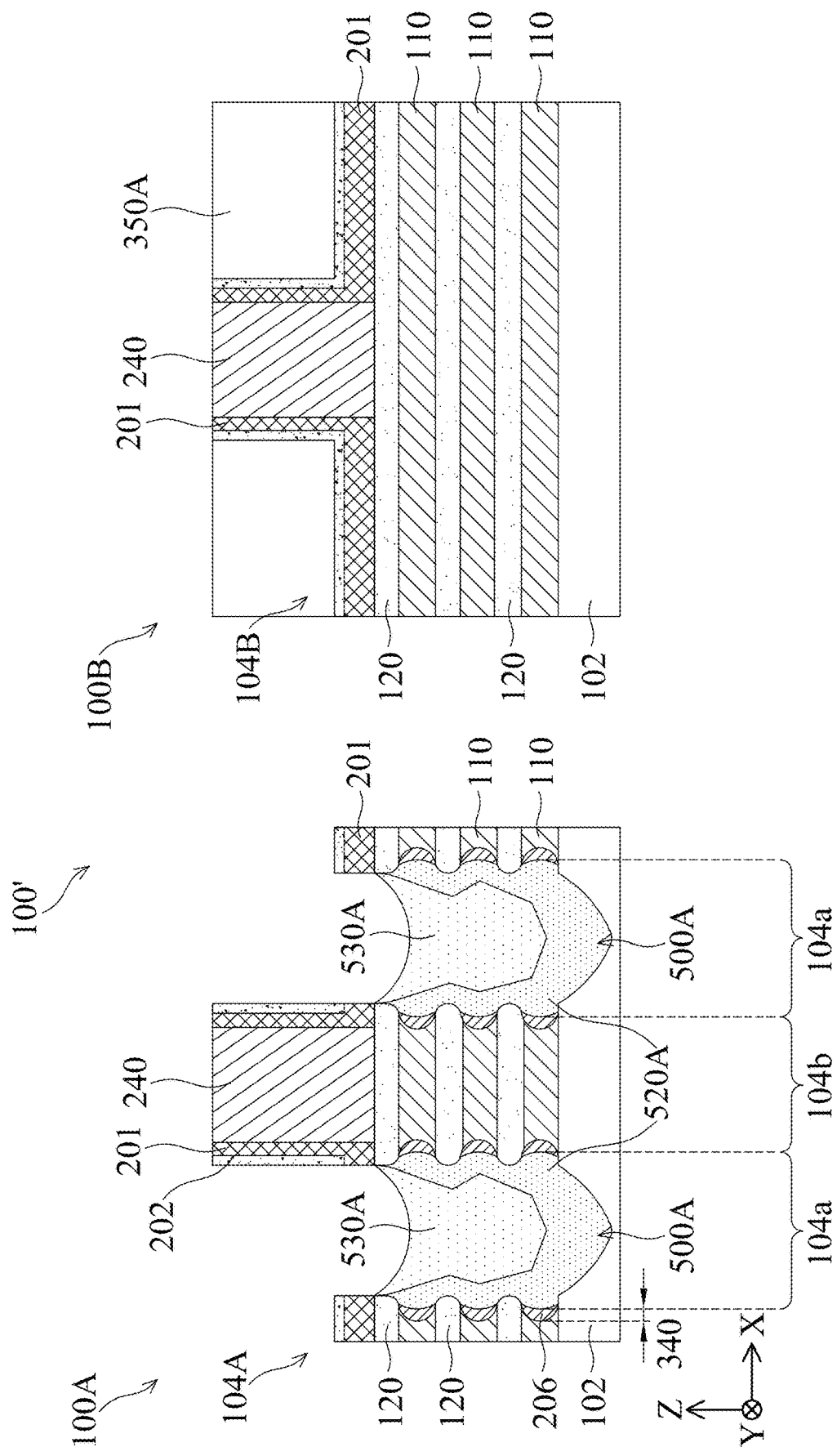

Referring to blocks 18'-22' of FIG. 15A and FIG. 16, processing is directed to the PMOS region and do not affect the NMOS region. For example, a mask element 350A is formed to cover the NMOS region, while leaving the PMOS region exposed. In some embodiments, a photoresist is implemented in forming the mask element 350A. Referring to block 18', an etching process etches into the exposed source/drain regions 104a in the PMOS region, and thereby forming the source/drain trenches. For example, the spacer layers 202 may be used as a mask in the etching of the source/drain trenches. In other words, this process may be self-aligned to the spacer layers 202. In some embodiments, the source/drain trenches have similar profiles as the source/drain trenches 204 described above with respect to FIG. 5. The photoresist implemented in forming the mask element 350A may be removed at this stage. Referring to block 20' of FIG. 15A, the semiconductor layers 110 are laterally etched to remove the end portions thereby forming gaps between vertically adjacent semiconductor layers 120. Referring to block 22' of FIG. 15A, inner spacers are formed in the gaps. These processing steps associated with blocks 18'-22' each resemble processing block 18-22 of FIG. 2A, respectively.

Referring to blocks 24' of FIG. 15A and FIG. 16, epitaxial layers 520A are formed in the source/drain trenches of the PMOS region. In some embodiments, the epitaxial layers 520A are formed to directly contact a bottom surface of the source/drain trenches. Moreover, the epitaxial layers 520A are also formed on sidewall surfaces of the source/drain trenches, such that the epitaxial layers 520A directly interface with the semiconductor layers 120 and the inner spacers 206. Accordingly, the epitaxial layers 520A extend from the bottom surfaces of the source/drain trenches and from below the bottom surface of the lowest semiconductor layers 120 to the top surface of the highest semiconductor layers 120. In other words, the epitaxial layers 520A not only fully occupy the sub-channel regions of the source/drain trenches, but also directly interface with the semiconductor layers 120. In some embodiments, the epitaxial layers 520A may have a "U"-shaped profile. As described above, the epitaxial layers 520A are configured for a PMOS. In the depicted embodiments, the epitaxial layers 520A has a profile and physical dimension that resembles the collective profiles and physical dimensions of the epitaxial layers 510 and 520 described above with respect to FIGS. 9-10. However, the epitaxial layers 520A may have any suitable profile and physical dimensions for a p-type epitaxial layer. The epitaxial layers 520A includes a p-type semiconductor epitaxy material, such as Si, SiGe, Ge, or combinations thereof. In some embodiments, the epitaxial layers 520A may include a p-type dopant such as boron, gallium, other suitable p-type dopant, or combinations thereof. In some embodiments, the p-type dopant may be included at a concentration of about $1 \times 10^{21}$ atoms/cm$^3$ to about $3 \times 10^{21}$ atoms/cm$^3$.

Referring to block 26' of FIG. 15A and FIG. 16, epitaxial layers 530A are formed over the epitaxial layers 520A. The epitaxial layers 530A may have profile and physical dimensions that resemble the epitaxial layer 530 described above with respect to FIG. 11. Here, the epitaxial layer 530A includes a p-type epitaxial material such as Si, SiGe, Ge, or combinations thereof. The epitaxial layers 530A may have a same or different dopant structure as that of the epitaxial layers 520A. For example, the epitaxial layers 530A may include B, Ga, or combinations thereof at a concentration of about $1 \times 10^{21}$ atoms/cm$^3$ to about $8 \times 10^{21}$ atoms/cm$^3$. In the depicted embodiments, the epitaxial layers 520A and 530A collectively form the epitaxial source/drain features 500A. However, in some embodiments, the source/drain features may include fewer or more epitaxial layers. Following the formation of the epitaxial source/drain features 500A, the mask element 350A is removed.

Processing continues to process the NMOS region. Referring to block 28' of FIG. 15B and FIG. 17, a mask element 350B is formed over the PMOS region while exposing the NMOS region. A photoresist is may be implemented in forming the mask element 350B. An etching process etches into the exposed source/drain regions 104a in the NMOS region, and thereby forming the source/drain trenches. In some embodiments, the source/drain trenches have similar profiles as the source/drain trenches 204 described above. The photoresist implemented in forming the mask element 350B is then removed. Referring to block 30' of FIG. 15B, the semiconductor layers 110 are laterally etched to remove the end portions thereby forming gaps between adjacent semiconductor layers 120. Referring to block 32' of FIG. 15B, inner spacers 206 are formed in the gaps. These processing steps associated with blocks 28'-32' each resemble processing block 18-22 of FIG. 2A, respectively.

Figure 15B:
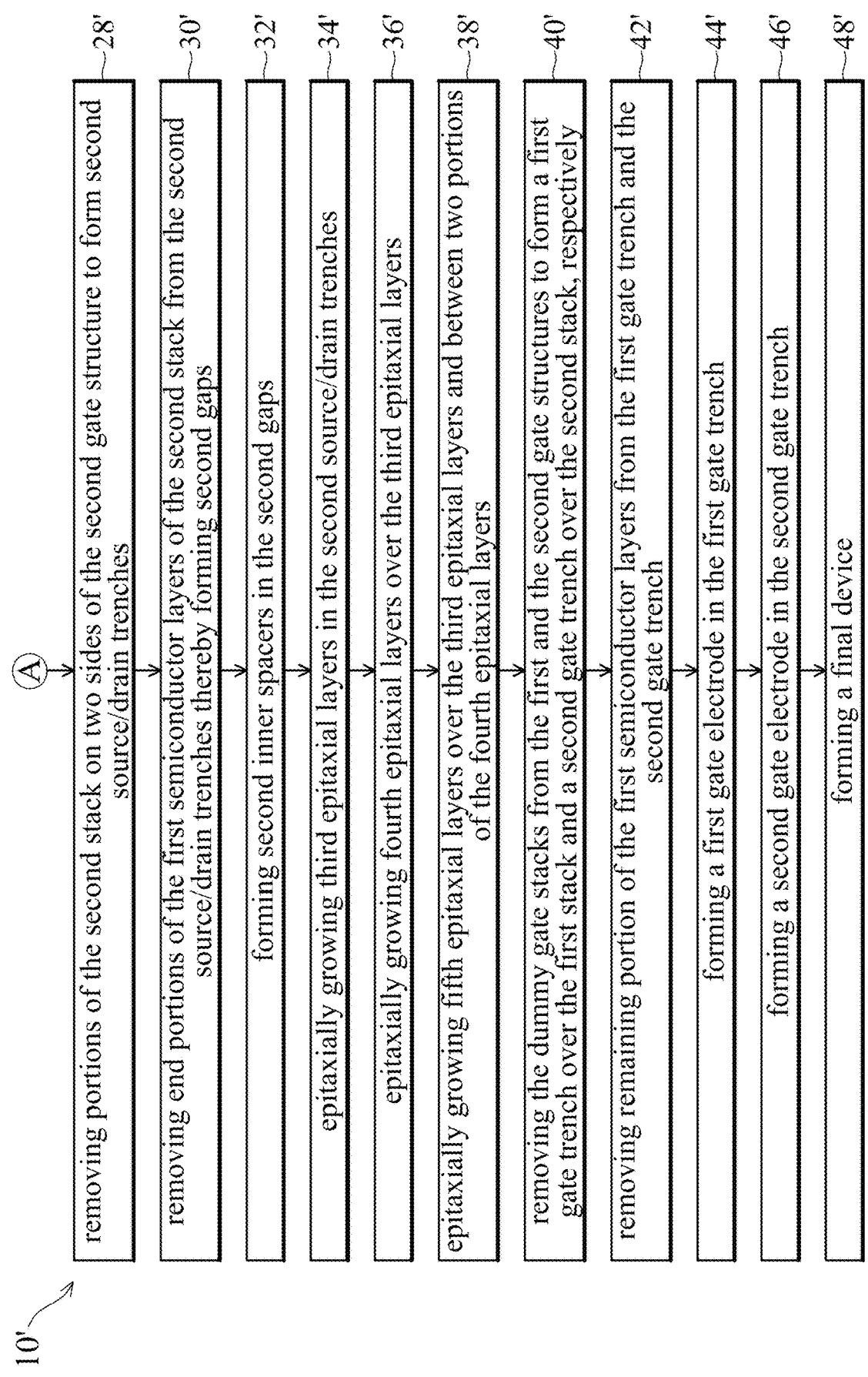
Figure 17:
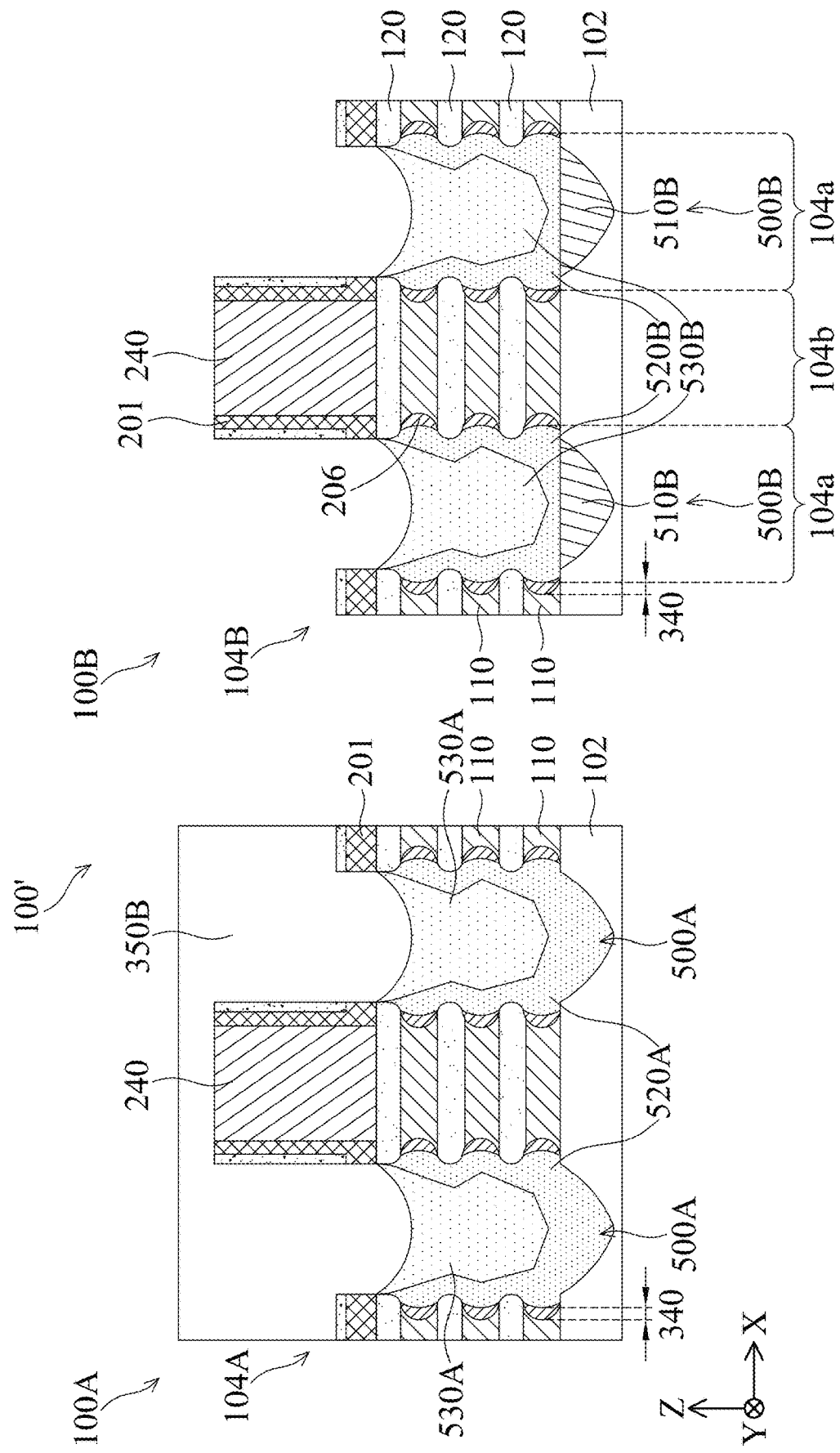

Referring to block 34' of FIG. 15B and FIG. 17, epitaxial layers 510B are formed in the source/drain trenches of the NMOS region. In some embodiments, the epitaxial layers 510B resemble the epitaxial layers 510 described above with respect to FIG. 9. Referring to block 36' of FIG. 15B and FIG. 17, epitaxial layers 520B are formed in the source/drain trenches of the NMOS region and on top surfaces of the epitaxial layers 510B. In some embodiments, the epitaxial layers 520B resemble the epitaxial layers 520 described above with respect to FIG. 10. Referring to block 38' of FIG. 15B and FIG. 17, epitaxial layers 530B are formed in the source/drain trenches of the NMOS region and over the top surfaces of the epitaxial layers 510B. Moreover, the epitaxial layers 530B are formed in between two portions of the epitaxial layers 520B. In some embodiments, the epitaxial layers 530B resemble the epitaxial layers 530 described above with respect to FIG. 11. Accordingly, epitaxial layers 510B, 520B, and 530B are formed to have properties similar to those of epitaxial layers 510, 520, and 530 already described, respectively. For example, epitaxial layers 510B may have a dopant structure (including dopant type, dopant concentration, dopant profile, etc.) configured to minimize the charge carrier mobility in the epitaxial layers 510B; epitaxial layers 530B may have a dopant structure configured to maximize the charge carrier mobility in the epitaxial layers 530B; while the epitaxial layers 520B may have a dopant structure that provide intermedium charge carrier mobility in the epitaxial layers 520B. In the depicted embodiments, the epitaxial layers 510B includes C at a concentration of less than about $1\times10^{18}$ atoms/cm$^3$; the epitaxial layers 520B includes As at a concentration of about $1\times10^{21}$ atoms/cm$^3$ to about $3\times10^{21}$ atoms/cm$^3$; and the epitaxial layers 530B includes P at a concentration of about $1\times10^{21}$ atoms/cm$^3$ to about $8\times10^{21}$ atoms/cm$^3$. The epitaxial layers 510B, 520B, and 530B collectively form the epitaxial source/drain features 500B.

As can be seen from the description above, the epitaxial source/drain features 500B have structures that differ from the epitaxial source/drain features 500A. For example, the epitaxial source/drain features 500A may include two epitaxial layers, while the epitaxial source/drain features 500B include three epitaxial layers. Moreover, the epitaxial layers 520A may extend from a bottom surface of the source/drain trench to a top surface of the source/drain trench; while the epitaxial layers 510B extend from the bottom surface of the source/drain trench to a top surface of the substrate 102, and the epitaxial layers 520B extend from the top surface of the substrate 102 to a top surface of the source/drain trenches. Additionally, the dopant profiles within the epitaxial source/drain features 500A and 500B may be different. For example, the epitaxial source/drain features 500A may include two dopant elements, while the epitaxial source/drain features 500B may include three dopant elements. Other parameters or features may also vary between these two source/drain features.

Figure 18:
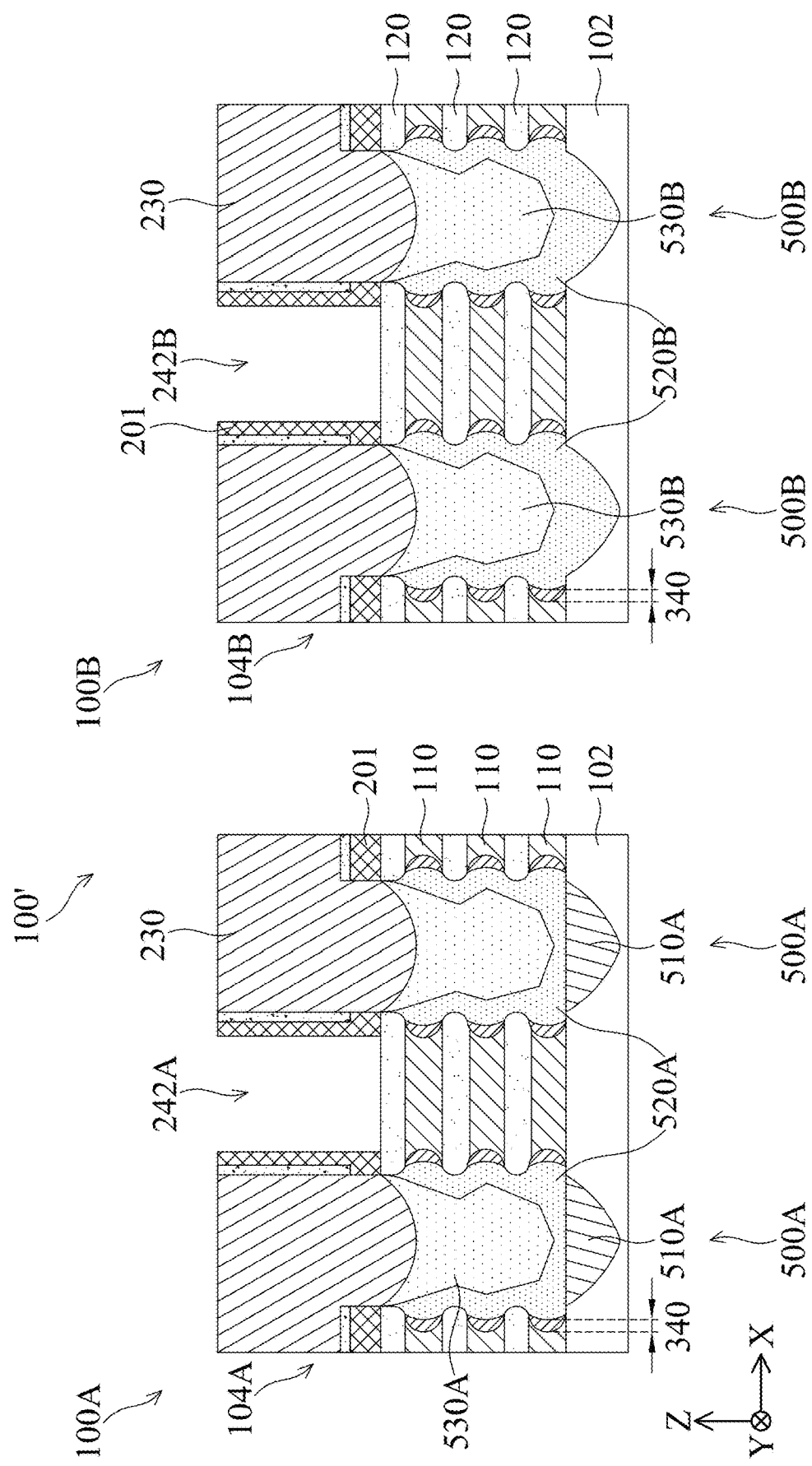

Referring to block 40' of FIG. 15B and FIG. 18, processing continues to form an ILD layer 230 on top surfaces of the epitaxial source/drain features 500A and 500B. In some embodiments, an etch-stop layer 220 is formed between the epitaxial source/drain features 500A and the ILD layer 230 and between the epitaxial source/drain features 500B and the ILD layer 230. Subsequently, the dummy gate stacks are removed from the gate structures 250. Accordingly, gate trenches 242A and 242B are formed for the PMOS region and the NMOS region, respectively. The gate trenches 242A and 242B expose sidewall surfaces of the stack of semiconductor layers 110 and 120. The processing for the block 40' of the FIG. 15B resembles that described above with respect to block 30 of FIG. 2B. Referring to block 42' of FIG. 15B and FIG. 19, remaining portions of the semiconductor layers 110 are removed from the exposed sidewall surfaces of the stack. This forms suspended semiconductor layers 120 (or channel layers 120) for both PMOS region and the NMOS region. This process for the block 42' resembles that described above with respect to block 32 of FIG. 2B.

Figure 19:
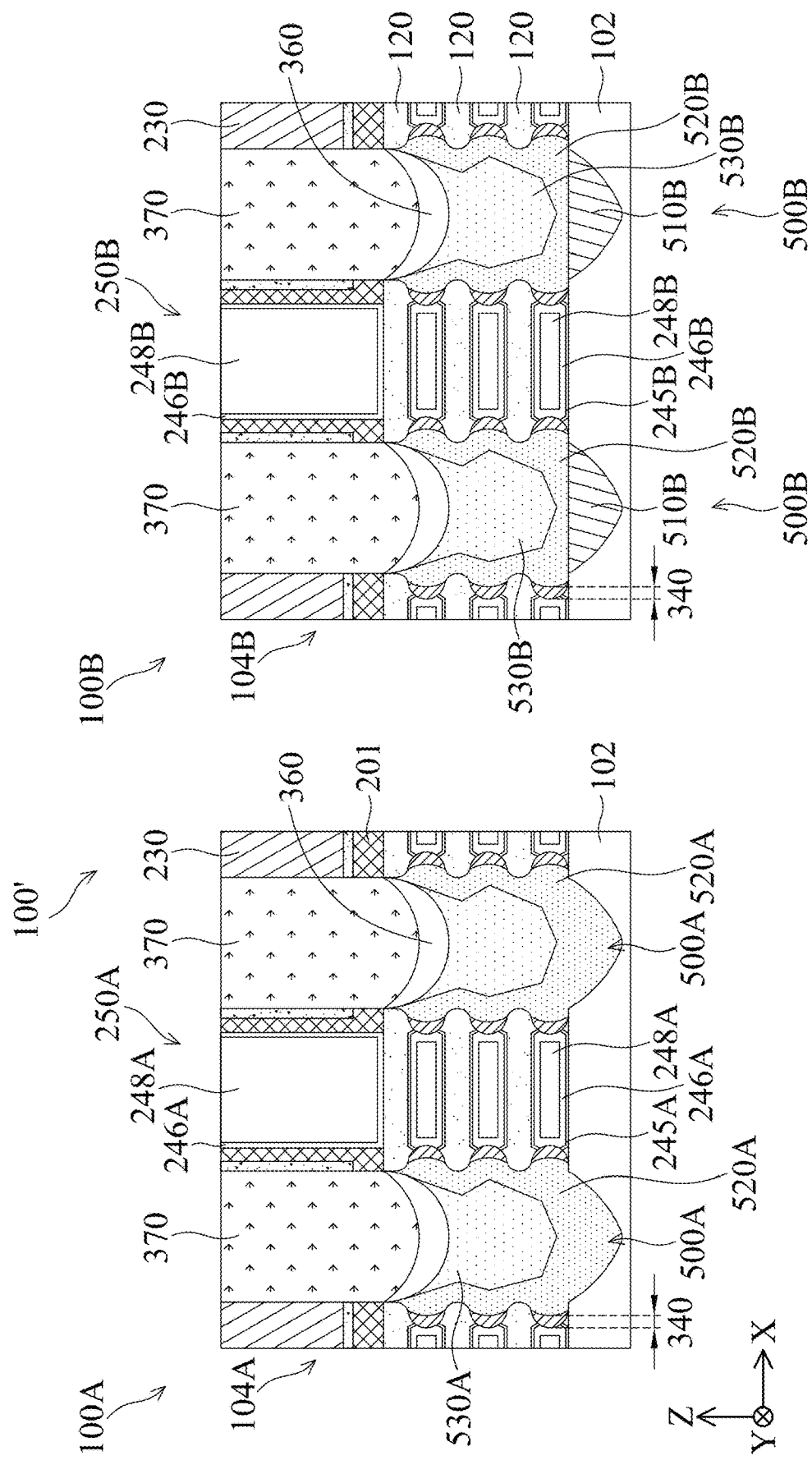

Referring to blocks 44' and 46' of FIG. 15B and FIG. 19, metal gate stacks are formed in the gate trenches 242A and 242B, respectively. The metal gate stacks in the PMOS region may include gate dielectric layers 246A, conductive metal layer 248A, and optionally interfacial layers 245A. The metal gate stacks in the NMOS region may include gate dielectric layers 246B, conductive metal layer 248B, and optionally interfacial layers 245B. The gate dielectric layers 246A and 246B may include materials independently chosen from the options for gate dielectric layers 246 described above with respect to FIG. 14; and that the interfacial layers 245B may include materials described above for interfacial layers 245 with respect to FIG. 14. The conductive metal layers 248A may include suitable p-type metal materials, and the conductive metal layers 248B may include suitable n-type metal materials, similar to those conductive metal layers 248 described above with respect to FIG. 14. Referring to blocks 48' of FIG. 15B, and FIG. 19, additional processing steps may be conducted to complete the fabrications of the CMOS device. For example, contact features 370, via features, metal features, etc. may be further formed.

Figure 20:
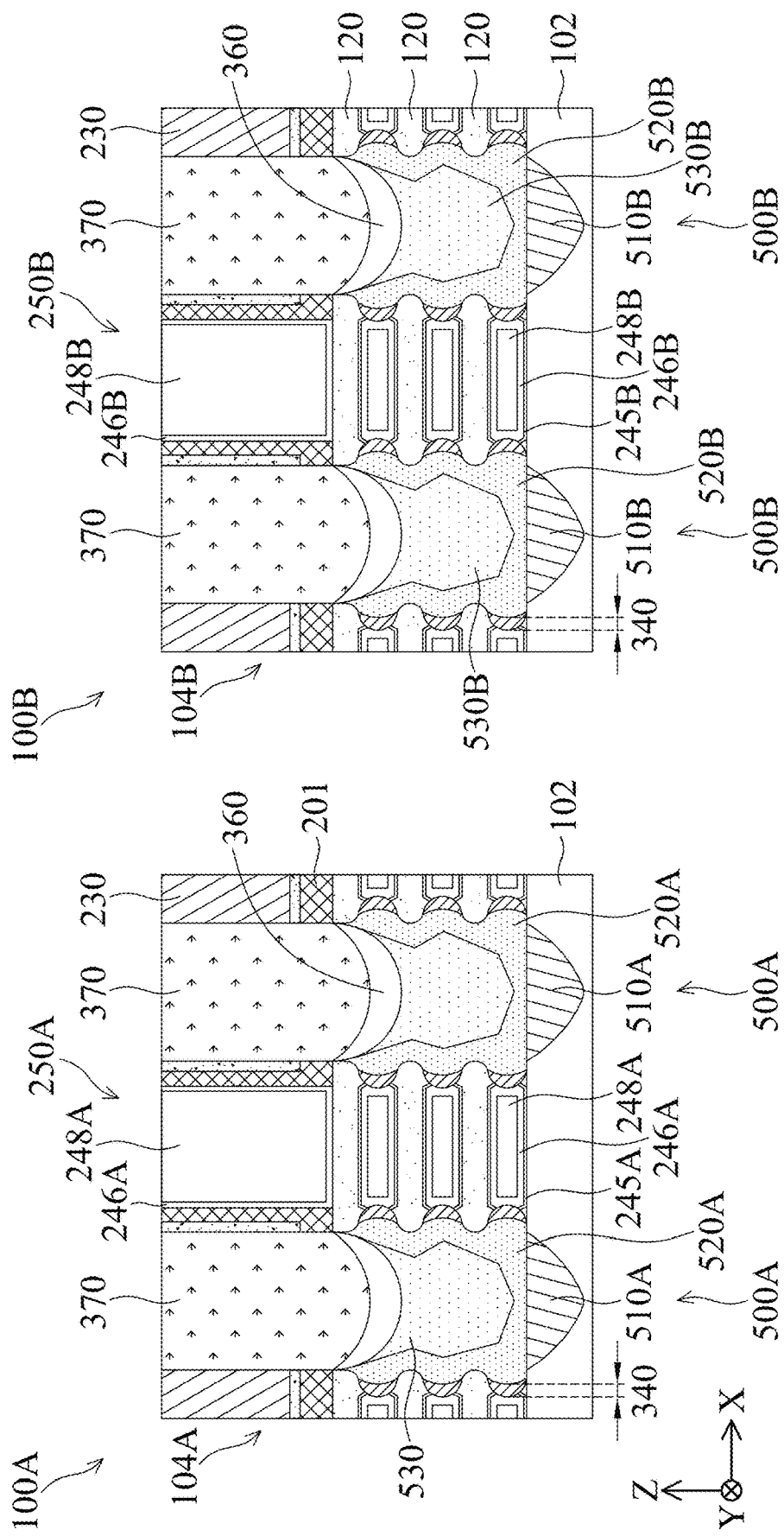

FIG. 19 illustrate a CMOS device where the NMOS component implement a three-layer epitaxial source/drain structure, while the PMOS component implement a two-layer epitaxial source/drain structure. In such embodiments, the NMOS may have reduced electron mobility in the sub-channel epitaxial layer and therefore have reduced leakage current through the bottom channel. In some embodiments, the PMOS component may implement the three-layer epitaxial source/drain structure, while the NMOS component may implement a two-layer epitaxial source/drain structure. Accordingly, the PMOS may have reduced hole mobility in the sub-channel epitaxial layer and therefore have reduced leakage current through the bottom channel. In some embodiments, such as those depicted in FIG. 20, both the NMOS component and the PMOS component may implement the three-layer epitaxial source/drain structure. Accordingly, both NMOS and the PMOS may have reduced charge carrier mobility in the respective sub-channel epitaxial layers and therefore have reduced leakage currents through the respect bottom channels.

Methods 10 and 10' above describe two example methods of the present disclosure. Processing steps may be added to or eliminated from the methods 10 or 10' before or after any of the described steps. Additional steps can be provided before, during, and after the method 10 or 10', and some of the steps described may be replaced or eliminated, for additional embodiments of the method. It is further understood that additional features can be added in the device 100 or 100', and some of the features described may be replaced or eliminated, for additional embodiments of the device 100 or 100'.

Though not intended to be limiting, embodiments of the present disclosure offer benefits for semiconductor processing and semiconductor devices. For example, the disclosed method provides nano-sheet-based devices having reduced charge carrier mobility in the sub-channel region of the source/drain features. As a result, current leakage in the OFF-state is reduced or mitigated without sacrificing performance (such as device speeds). For example, SRAM cells implementing the present methods have been shown to present cell current that is improved by a factor of about 3%. Furthermore, the variation in the threshold voltage has been shown to reduce by about 1 mV; and the $V_{cc\text{-}min}$ has been shown to reduce by about 10 mV. Moreover, the FEOL capacitances (such as gate-to-drain capacitance $C_{gd}$ and total gate capacitance $C_{gg}$) are also reduced. As a result, the nano-sheet-based device may have overall better performance, functionalities, an/or reliability as compared to approaches not implementing the methods disclosed herein. Different embodiments may provide different benefits, and not all benefits are required for any specific embodiment.

In an exemplary aspect, the present disclosure is directed to a semiconductor device. The semiconductor device includes a substrate, two source/drain features over the substrate, channel layers connecting the two source/drain features, and a gate structure wrapping around each of the channel layers. Each of the two source/drain features include a first epitaxial layer, a second epitaxial layer over the first epitaxial layer, and a third epitaxial layer on inner surfaces of the second epitaxial layer. The channel layers directly interface with the second epitaxial layers and are separated from the third epitaxial layers by the second epitaxial layers. The first epitaxial layers include a first semiconductor material with a first dopant. The second epitaxial layers include the first semiconductor material with a second dopant. The second dopant has a higher mobility than the first dopant.

In some embodiments, a top surface of the first epitaxial layers extends along a top surface of the substrate. In some embodiments, the first semiconductor material is silicon, the first dopant is carbon, and the second dopant is an n-type dopant. In some embodiments, the first semiconductor material is silicon and the second dopant is arsenic. In some embodiments, the third epitaxial layers include a third dopant, and the third dopant is different from the first and the second dopants. In some embodiments, the second dopant and the third dopant are both n-type dopants. In some embodiments, the second dopant has a second mobility; the third dopant has a third mobility; and the second mobility is less than the third mobility. In some embodiments, an atomic percentage of the first dopant in the first epitaxial layers is about 10% to about 30%, an atomic percentage of the second dopant in the second epitaxial layers is about 10% to about 30%, and an atomic percentage of the third dopant in the third epitaxial layers is about 30% to about 80%. In some embodiments, the semiconductor device further includes a silicide layer. The silicide layer has a bottom surface interfaced with the third epitaxial layers and sidewall surfaces interfaced with the second epitaxial layers. The silicide layer is spaced away from the first epitaxial layers. In some embodiments, the third epitaxial layer has a bottom surface that extends below a bottom surface of a lowest layer of the channel layers. In some embodiments, the second epitaxial layer has a sidewall surface that includes a plurality of s-shaped segments.

In an exemplary aspect, the present disclosure is directed to a semiconductor device. The semiconductor device includes a substrate; two source/drain features over the substrate; and suspended channel layers connecting the two source/drain features. Each of the source/drain features include a first epitaxial layer, a second epitaxial layer on sidewalls of the first epitaxial layer, and a third epitaxial layer below the first and the second epitaxial layers and below a lowest layer of the suspended channel layers. The first epitaxial layer includes a first dopant, the second epitaxial layer includes a second dopant, and the third epitaxial layer includes a third dopant. The first, the second, and the third dopants are different from one another. Each of the suspended channel layers directly interface with the first epitaxial layer of the source/drain features.

In some embodiments, the first epitaxial layers each interpose between the suspended channel layers and one of the second epitaxial layers. In some embodiments, the second epitaxial layer is spaced away from the third epitaxial layer. In some embodiments, the third dopant is carbon. In some embodiments, the first dopant is arsenic, and the second dopant is phosphorous.

In an exemplary aspect, the present disclosure is directed to a method. The method includes receiving a semiconductor structure. The semiconductor structure has a semiconductor channel on a substrate and source/drain trenches in the substrate and on both sides of the semiconductor channel. The method also includes epitaxially growing first epitaxial layers in the source/drain trenches. A top surface of the first epitaxial layers extends along or below a bottom surface of the semiconductor channel. The first epitaxial layers include a first dopant. The method further includes epitaxially growing second epitaxial layers on the first epitaxial layers and on sidewalls surfaces of the source/drain trenches. The second epitaxial layers are connected to the semiconductor channel and include a second dopant. The method additionally includes epitaxially growing third epitaxial layers on top surface of the second epitaxial layers. The third epitaxial layers include a third dopant. The third epitaxial layers are spaced away from the semiconductor channel. Moreover, the first dopant is different form the second and the third dopants.

In some embodiments, the semiconductor channel is a layer of a stack of semiconductor channel layers. Each of the stack of semiconductor channel layers are between two vertically adjacent sacrificial layers. The method further includes removing a first portion of the sacrificial layers exposed in the source/drain trenches to form first gaps between two vertically adjacent semiconductor channel layers. Moreover, the method also includes forming spacer layers in the first gaps. The epitaxially growing of the second epitaxial layers includes epitaxially growing the second epitaxial layers on sidewall surfaces of the spacer layers. In some embodiments, the source/drain trenches are first source/drain trenches in a first region of the substrate, the semiconductor channel is a first semiconductor channel in the first region, and the semiconductor structure includes second source/drain trenches in a second region of the substrate and a second semiconductor channel in the second region. Moreover, the method further includes epitaxially growing fourth epitaxial layers on bottom surfaces and sidewall surfaces of the second source/drain trenches. The fourth epitaxial layers are connected to the second semiconductor channel. Additionally, the method includes epitaxially growing fifth epitaxial layers on top surfaces of the fourth epitaxial layers. The fourth and fifth epitaxial layers are doped with a dopant that has a conductivity type opposite to that of the first, second, and third dopants. In some embodiments, the epitaxially growing of the second epitaxial layers includes epitaxially growing the second epitaxial layers spaced away from the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first pair of source/drain features;
a first stack of channel layers connected to the first pair of source/drain features;
a second pair of source/drain features; and
a second stack of channel layers connected to the second pair of source/drain features,
wherein the first pair of source/drain features each include a first epitaxial layer doped with a first dopant, a second epitaxial layer doped with a second dopant and disposed over the first epitaxial layer and connected to the first stack of channel layers, and a third epitaxial layer doped with a third dopant and disposed over the second epitaxial layer,
wherein the second pair of source/drain features each include a fourth epitaxial layer doped with a fourth dopant and connected to the second stack of channel layers, and a fifth epitaxial layer doped with a fifth dopant and disposed over the fourth epitaxial layer, and
wherein the first dopant, the second dopant, the third dopant, and the fourth dopant are of different species.

2. The semiconductor structure of claim 1, wherein the second dopant and the third dopant are n-type dopants, and the fourth dopant and the fifth dopant are p-type dopants.

3. The semiconductor structure of claim 1, wherein the first dopant is carbon, the second dopant is arsenic, and the third dopant is phosphorous.

4. The semiconductor structure of claim 1, wherein the fourth dopant and the fifth dopant each include boron, boron fluoride, gallium, or a combination of.

5. The semiconductor structure of claim 1, further comprising a silicide layer disposed over each of the first pair of source/drain features,
wherein the silicide layer is in direct contact with the second epitaxial layer and the third epitaxial layer.

6. The semiconductor structure of claim 1, wherein the fifth epitaxial layer has a bottom surface that extends below a bottom surface of a lowest channel layer of the second stack of channel layers.

7. The semiconductor structure of claim 1, wherein the fourth dopant and the fifth dopant are both boron,
wherein a concentration of the fourth dopant in the fourth epitaxial layer is about $1\times10^{21}$ atoms/cm$^3$ to about $3\times10^{21}$ atoms/cm$^3$, and
wherein a concentration of the fifth dopant in the fifth epitaxial layer is about $1\times10^{21}$ atoms/cm$^3$ to about $8\times10^{21}$ atoms/cm$^3$.

8. The semiconductor structure of claim 1, wherein the first epitaxial layer, the second epitaxial layer, and the third epitaxial layer each include silicon, and
wherein the fourth epitaxial layer and the fifth epitaxial layer each include silicon, silicon germanium, germanium, or combinations thereof.

9. A semiconductor structure, comprising:
a first region and a second region;
a first source/drain feature disposed over the first region;
a first channel layer connected to the first source/drain feature;
a second source/drain feature disposed over the second region;
a second channel layer connected to the second source/drain feature,
wherein the first source/drain feature includes a first epitaxial layer doped with a first dopant and disposed on the first region, a second epitaxial layer doped with a second dopant and disposed over the first epitaxial layer and along a sidewall of the first channel layer, and a third epitaxial layer doped with a third dopant and embedded in the second epitaxial layer,
wherein the second source/drain feature includes a fourth epitaxial layer doped with the first dopant and disposed on the second region, a fifth epitaxial layer doped with a fourth dopant and disposed over the fourth epitaxial layer and along a sidewall of the second channel layer, and a sixth epitaxial layer doped with a fifth dopant and embedded in the fifth epitaxial layer,
wherein the first dopant is different from the second dopant, the third dopant, the fourth dopant, and the fifth dopant in species, and
wherein the second dopant and the third dopant are of a first conductivity type, and the fourth dopant and the fifth dopant are of a second conductivity type different from the first conductivity type.

10. The semiconductor structure of claim 9, wherein the first epitaxial layer includes a top surface extending at a same level or above a top surface of the substrate under the channel layers.

11. The semiconductor structure of claim 9, wherein the fourth dopant and the fifth dopant include boron, boron fluoride, gallium, or a combination of.

12. The semiconductor structure of claim 9, wherein the first dopant is carbon, and
wherein the first conductivity type is n-type and the second conductivity type is p-type.

13. The semiconductor structure of claim 9, wherein a charge carrier has a first mobility in the first epitaxial layer, a second mobility in the second epitaxial layer, and a third mobility in the third epitaxial layer,
wherein the first mobility is lower than the second mobility and the second mobility is lower than the third mobility.

14. The semiconductor structure of claim 9, wherein the first dopant has a first concentration in the first epitaxial layer, and the second dopant has a second concentration in the second epitaxial layer greater than the first concentration.

15. The semiconductor structure of claim 9, wherein the first epitaxial layer and the fourth epitaxial layer directly contact the substrate.

16. A method, comprising:
receiving a semiconductor structure, wherein the semiconductor structure includes:
a substrate,
a first semiconductor channel and first source/drain trenches over a first region of the substrate, and
a second semiconductor channel and second source/drain trenches over a second region of the substrate;
epitaxially growing first epitaxial layers in the first source/drain trenches, wherein the first epitaxial layers include a first dopant;
epitaxially growing second epitaxial layers on the first epitaxial layers and on sidewalls surfaces of the first source/drain trenches, wherein the second epitaxial layers include a second dopant; and
epitaxially growing third epitaxial layers on the second epitaxial layers, wherein the third epitaxial layers include a third dopant;
epitaxially growing fourth epitaxial layers on bottom surfaces and sidewall surfaces of the second source/drain trenches, wherein the fourth epitaxial layers include a fourth dopant; and
epitaxially growing fifth epitaxial layers on the fourth epitaxial layers, wherein the fifth epitaxial layers include the fourth dopant, wherein the second dopant and the third dopant are of a first conductivity type, and wherein the fourth dopant has a second conductivity type different from the first conductivity type.

17. The method of claim 16, wherein the first dopant is different from the second dopant and the third dopant in species, and wherein the first dopant is different from the fourth dopant and the fifth dopant in species.

18. The method of claim 16, wherein the first dopant is carbon, the first conductivity type is n-type, and the second conductivity type is p-type.

19. The method of claim 16, further comprising forming a silicide layer on the third epitaxial layer, wherein the silicide layer extends between inner sidewalls of the second epitaxial layer.

20. The method of claim 16, further comprising forming a first metal gate structure over the first semiconductor channel and a second metal gate structure over the second semiconductor channel, wherein the first metal gate structure includes a first work function metal of the first conductivity type, and wherein the second metal gate structure includes a second work function metal of the second conductivity type.

* * * * *